United States Patent
Eden et al.

(10) Patent No.: US 8,968,668 B2
(45) Date of Patent: Mar. 3, 2015

(54) ARRAYS OF METAL AND METAL OXIDE MICROPLASMA DEVICES WITH DEFECT FREE OXIDE

(75) Inventors: J. Gary Eden, Champaign, IL (US);
Sung-Jin Park, Champaign, IL (US);
Jin Hoon Cho, Champaign, IL (US);
Seung Hoon Sung, Beaverton, OR (US);
Min Hwan Kim, Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 33 days.

(21) Appl. No.: 13/527,842

(22) Filed: Jun. 20, 2012

(65) Prior Publication Data
US 2013/0071297 A1    Mar. 21, 2013

Related U.S. Application Data

(60) Provisional application No. 61/501,057, filed on Jun. 24, 2011.

(51) Int. Cl.
*B01J 19/08*    (2006.01)
*H01J 37/32*    (2006.01)
(Continued)

(52) U.S. Cl.
CPC ........... *H01J 37/32055* (2013.01); *C25D 11/02* (2013.01); *H01J 11/18* (2013.01); *C25D 11/12* (2013.01); *C25D 11/18* (2013.01);
(Continued)

(58) Field of Classification Search
CPC ..... H01J 37/32055; H01J 11/18; H01J 13/16; C25D 11/02; C25D 11/12; C25D 11/18; C25D 11/026; C25D 11/022; C25D 11/26

USPC ................ 422/186, 186.03, 186.04; 205/112; 313/231.31
See application file for complete search history.

(56) References Cited

U.S. PATENT DOCUMENTS 3,551,303 A    12/1970    Suzuki et al.
5,441,627 A    8/1995    Kato et al.
(Continued)

FOREIGN PATENT DOCUMENTS

EP    1 486 775    12/2004
JP    10-121922    5/1998
(Continued)

OTHER PUBLICATIONS

Jessensky, O., et. al., "Self-organized formation of hexagonal pore arrays in anodic alumina" *Applied Physics Letters*, vol. 72, No. 10, Mar. 1998.
(Continued)

*Primary Examiner* — Xiuyu Tai
(74) *Attorney, Agent, or Firm* — Greer, Burns & Crain, Ltd.

(57) ABSTRACT

A microplasma device of the invention includes a microcavity or microchannel defined at least partially within a thick metal oxide layer consisting essentially of defect free oxide. Electrodes are arranged with respect to the microcavity or microchannel to stimulate plasma generation in said microcavity or microchannel upon application of suitable voltage and at least one of the electrodes is encapsulated within the thick metal oxide layer. Large arrays can be formed and are highly robust as lack of microcracks in the oxide avoid dielectric breakdown.

13 Claims, 24 Drawing Sheets

(51) Int. Cl.
*C25D 11/02* (2006.01)
*H01J 11/18* (2012.01)
*C25D 11/12* (2006.01)
*C25D 11/18* (2006.01)
*C25D 11/26* (2006.01)
*H01J 17/16* (2012.01)

(52) U.S. Cl.
CPC ............. *C25D 11/26* (2013.01); *C25D 11/022* (2013.01); *H01J 17/16* (2013.01); *C25D 11/026* (2013.01)
USPC .................. 422/186; 422/186.03; 422/186.04; 205/112; 313/231.31

(56) References Cited

U.S. PATENT DOCUMENTS

| | | | |
|---|---|---|---|
| 6,353,289 | B1 | 3/2002 | Ishigami et al. |
| 7,573,202 | B2 | 8/2009 | Eden et al. |
| 7,642,720 | B2 | 1/2010 | Eden et al. |
| 7,998,568 | B2 * | 8/2011 | Raja et al. ................. 428/305.5 |
| 2003/0203630 | A1 | 10/2003 | Geusic et al. |
| 2003/0230983 | A1 | 12/2003 | Vonallmen |
| 2005/0136609 | A1 | 6/2005 | Mosley et al. |
| 2006/0071598 | A1 | 4/2006 | Eden et al. |
| 2006/0082319 | A1 | 4/2006 | Eden et al. |
| 2007/0052359 | A1 | 3/2007 | Sanghoon et al. |
| 2007/0210709 | A1 | 9/2007 | Sanghoon et al. |
| 2008/0185579 | A1 | 8/2008 | Eden et al. |
| 2009/0295288 | A1 | 12/2009 | Eden et al. |
| 2010/0001629 | A1 | 1/2010 | Eden et al. |
| 2010/0072893 | A1 | 3/2010 | Eden et al. |
| 2011/0109224 | A1 | 5/2011 | Eden et al. |
| 2011/0148282 | A1 | 6/2011 | Eden et al. |
| 2011/0275272 | A1 | 11/2011 | Eden et al. |

FOREIGN PATENT DOCUMENTS

| | | |
|---|---|---|
| JP | 2005256071 | 9/2005 |
| WO | WO 2007/011388 | 1/2007 |
| WO | WO 2007/087285 | 8/2007 |
| WO | WO 2008/013820 | 1/2008 |
| WO | 2009140509 A1 | 11/2009 |
| WO | WO 2012/015943 | 2/2012 |

OTHER PUBLICATIONS

Kim, K. S., et. al., "Self-patterned aluminum interconnects and ring electrodes for arrays of microcavity plasma devices encapsulated in $Al_2O_3$", *J. Phys. D: Appl. Phys.*, 41 (2008) 012004.

Lee, C. J., et. al., "Field emission from well-aligned zinc oxide grown at a low temperature", *Applied Physics Letters*, vol. 81, No. 19, Nov. 4, 2002.

Masuda, Hideki, et. al., "Ordered Metal Nanohole Arrays by a Two-Step Replication of Honeycomb Structures of Anodic Alumina", *Science*, vol. 268, Jun. 9, 1995.

Park, Sung-Jin, et. al., "Flexible microdischarge array: Metal/polymer devices", *Applied Physics Letters*, vol. 77, No. 2, Jul. 10, 2000.

Park, Sung-Jin, et. al., "Nanoporous alumina as a dielectric for microcavit plasma devices: Multilayer $Al/Al_2O_3$ structures", *Applied Physics Letters*, 86, 221501, (2005).

Kim, Kwang Soo, et al., "27.3: Fully Addressable, Self-Assembled Microcavity Plasma Arrays: Improved Luminous Efficacy by Controlling Device Geometry", 2008 SID International Symposium, Society for Information Display, Los Angeles, CA, USA, May 18, 2008, pp. 382-384.

* cited by examiner

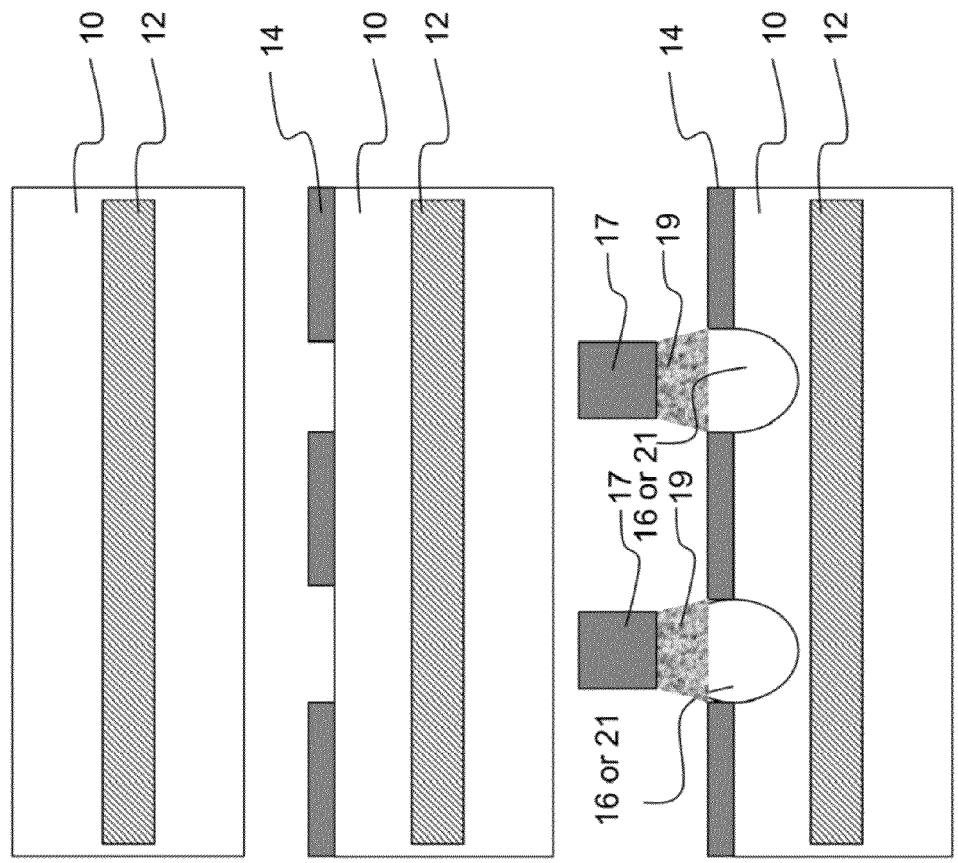

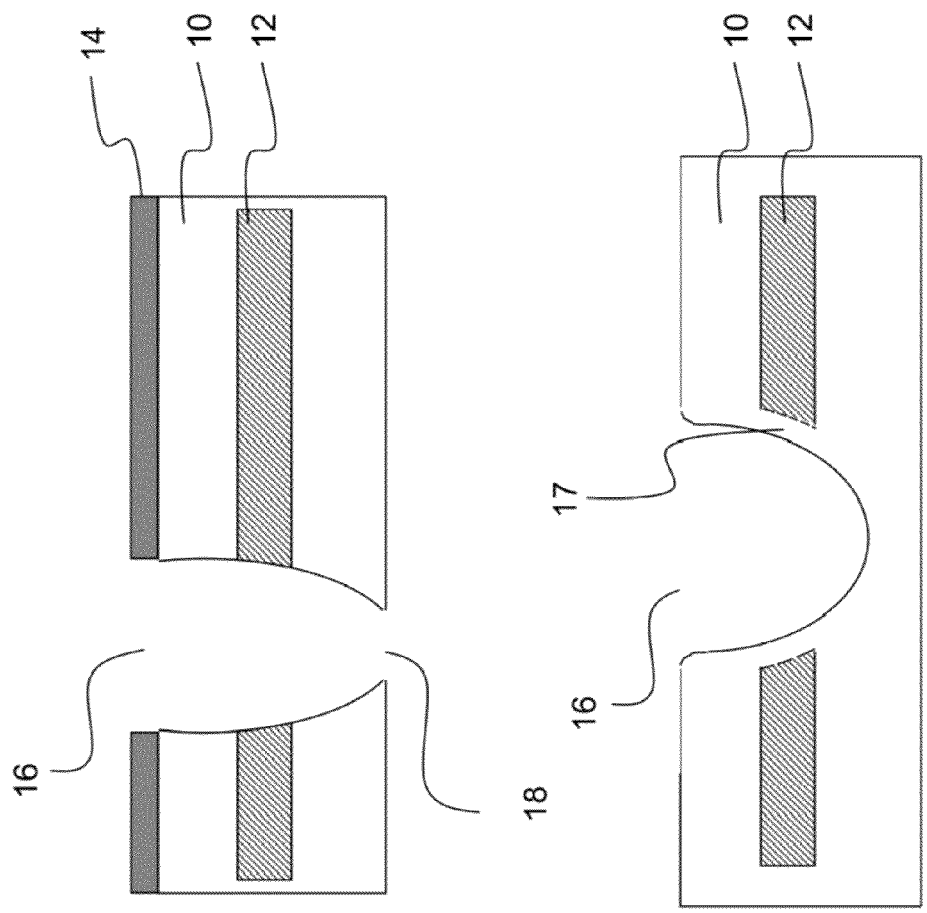

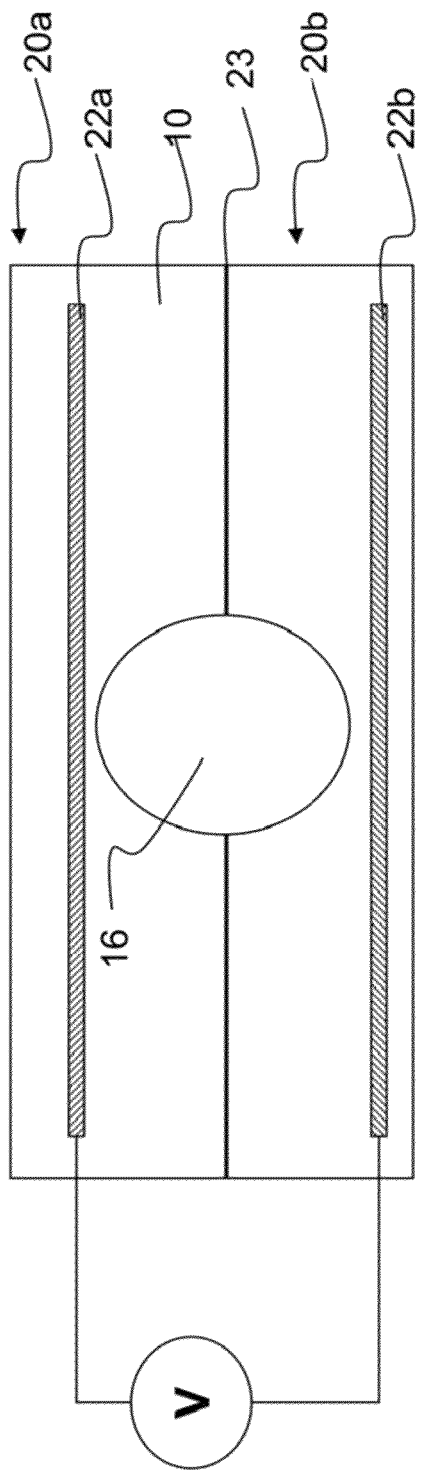

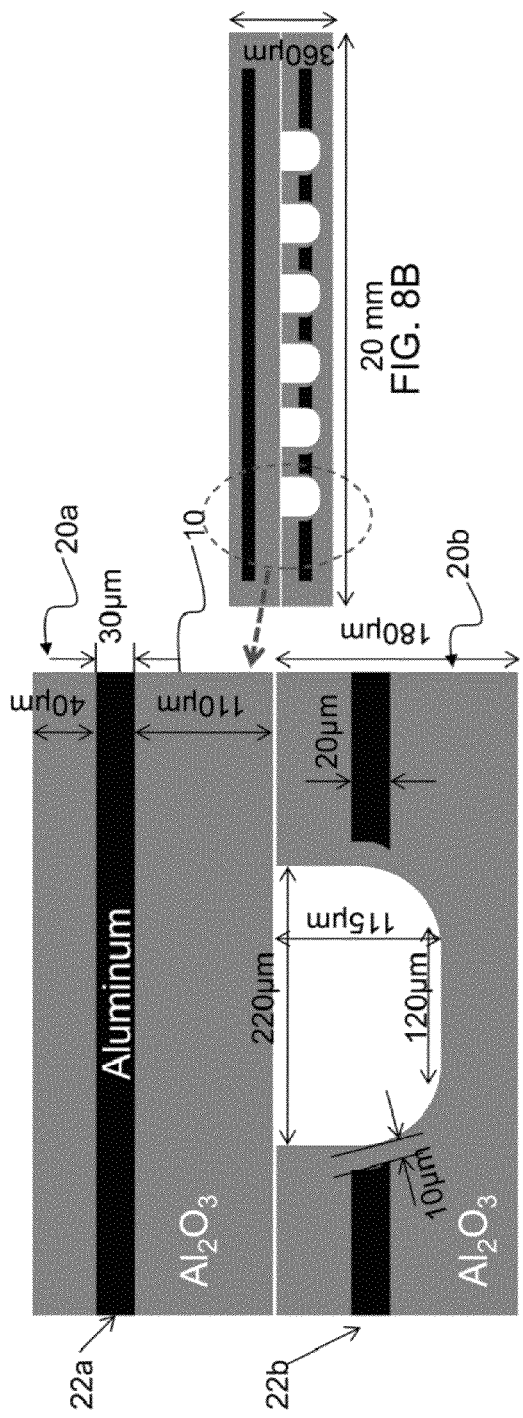
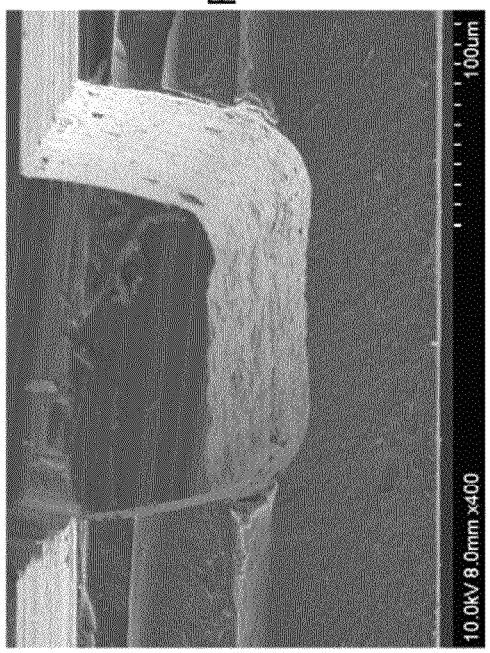

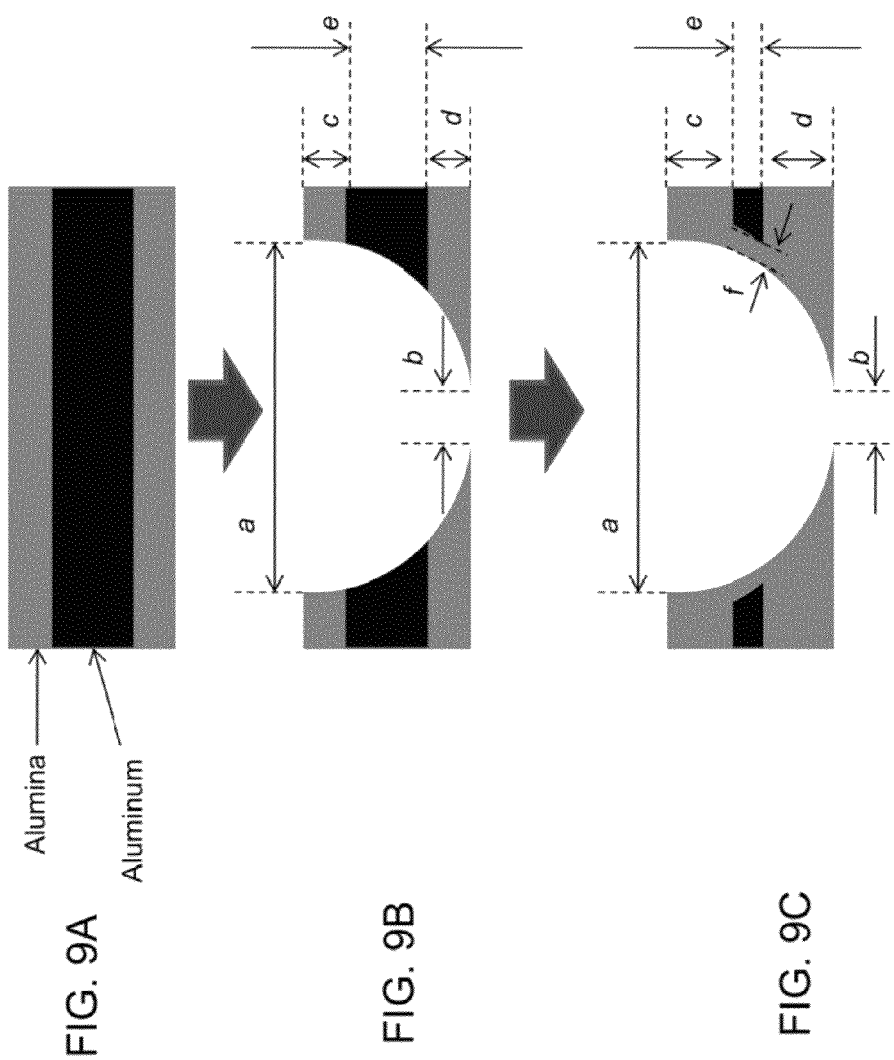

ARRAYS OF METAL AND METAL OXIDE MICROPLASMA DEVICES WITH DEFECT FREE OXIDE

PRIORITY CLAIM AND REFERENCE TO RELATED APPLICATION

The application claims priority under 35 U.S.C. §119 from prior provisional application Ser. No. 61/501,057, which was filed on Jun. 24, 2011.

STATEMENT OF GOVERNMENT INTEREST

This invention was made with Government assistance under U.S. Air to Force Office of Scientific Research grant No. FA9550-08-1-0246. The Government has certain rights in this invention.

FIELD OF THE INVENTION

The invention is in the field of microcavity and microchannel plasma devices, also known as microdischarge devices or microplasma devices.

BACKGROUND

Microcavity plasma devices produce a nonequilibrium, low temperature plasma within, and essentially confined to, a cavity having a characteristic dimension d below approximately 500 μm. This new class of plasma devices exhibits several properties that differ substantially from those of conventional, macroscopic plasma sources. Because of their small physical dimensions, microcavity plasmas normally operate at gas (or vapor) pressures considerably higher than those accessible to macroscopic devices. For example, microplasma devices with a cylindrical microcavity having a diameter of 200-300 μm (or less) are capable of operation at rare gas (as well as $N_2$ and other gases tested to date) pressures up to and beyond one atmosphere.

Such high pressure operation is advantageous. An example advantage is that, at these higher pressures, plasma chemistry favors the formation of several families of electronically-excited molecules, including the rare gas dimers ($Xe_2$, $Kr_2$, $Ar_2$, . . . ) and the rare gas-halides (such as XeCl, ArF, and $Kr_2F$) that are known to be efficient emitters of ultraviolet (UV), vacuum ultraviolet (VUV), and visible radiation. This characteristic, in combination with the ability of microplasma devices to operate in a wide range of gases or vapors (and combinations thereof), offers emission wavelengths extending over a broad spectral range. Furthermore, operation of the plasma in the vicinity of atmospheric pressure minimizes the pressure differential across the packaging material when a microplasma device or array is sealed.

Research by the present inventors and colleagues at the University of Illinois has resulted in new microcavity plasma device structures as well as applications. A particularly promising class of microcavity plasma device arrays is formed in metal and metal oxide. Large-scale, low-cost arrays of devices that can be flexible are formed by inexpensive processes with metal electrodes encapsulated in metal oxide. One problem that has arisen with such devices is the occurrence of defects in the oxide layer that encapsulates and protects the metal electrodes from plasma generated in the microcavities. During the formation of oxide over metal in which microcavities are formed in a metal sheet, the oxide can develop defects such as cracks. This is especially true in areas where the oxide is formed over the edges of microcavities.

Important arrays of metal and oxide microcavity plasma devices have been provided by past work at the University of Illinois. For example, Eden et al., U.S. Pat. No. 7,573,202 discloses metal and metal oxide arrays that are formed by growing a nanoporous dielectric on a metal substrate in which microcavities have been formed. Subsequent anodization forms a nanoporous oxide, which can also be backfilled with dielectrics, metals or carbon nanotubes, for example. This provides a high performance dielectric. However, the nanoporous dielectric can develop cracks, especially in areas near the rim of a microcavity.

The formation of microscopic cracks in the dielectric of a microplasma device can limit device lifetime and cause operational flaws. The cracks provide a pathway for dielectric breakdown that can disable portions or all of an array of devices. The excellent electrical breakdown characteristics of nanoporous alumina ($Al_2O_3$), for example, are of little consequence once a crack of sufficient size appears in a thin layer of the material.

Past efforts have been made to mitigate the appearance of cracks. One solution is to apply thin glass films to regions where cracking occurs. This increases cost and complexity in the manufacturing process. Another drawback is that glass has a melting point well below that of dielectrics such as $Al_2O_3$, which can limit operation of devices and arrays formed this way. The glass also generally overcoats the nanostructured alumina, reducing the dielectric strength offered by the network of hexagonal pores from which the alumina film is composed.

Eden et al, U.S. Pat. No. 8,004,017, discloses large arrays of metal/metal oxide microplasma devices and a fabrication method for the same. High quality, large arrays are formed. The fabrication method is a wet chemical process in which self-patterned circumferential electrodes are automatically formed around microcavities during an anodization process that converts metal to metal oxide. The size and pitch of the microcavities in a metal foil (or film) prior to anodization, as well as the anodization parameters, determine which of the microcavity plasma devices in a one or two-dimensional array are connected. The metal foil is obtained or fabricated with microcavities having any of a broad range of cross-sections (circular, square, etc.). The foil is anodized to form a nanostructured metal oxide layer. One or more self-patterned metal electrodes are automatically formed and simultaneously encapsulated in the metal oxide created by the anodization process. The electrodes form uniformly around the perimeter of each microcavity, and can be electrically isolated or connected in patterns. The shape of the electrodes that form around the microcavities is dependent upon the shape of the microcavities prior to anodization. The metal oxide formed by this method can also develop microcracks, especially in areas which traverse (or span) the rim or other sharp discontinuity associated with a microcavity. Areas immediately adjacent to such discontinuities are also susceptible to microcracks. With densely packed and larger scale areas, cracking is more prevalent.

Limiting the number of defects in large and densely packed arrays of microcavities and microcavity plasma devices has been accomplished with stress-reduction structures and techniques. Eden et al. U.S Patent Publication No. US 2010-0001629 provides such arrays via stress reduction structures, geometries and fabrication techniques that limit the tendency of large scale and densely packed arrays to crack and buckle due to mismatches in the coefficients of thermal expansion between the oxide and metal.

The present inventors have determined a significant cause of microcracking in metal oxide films, and methods to avoid such microcracking. Generally, nanoporous oxide grown from a flat or gently-curved surface will be high quality, presuming that all other growth parameters (such as temperature and rate) are chosen judiciously. In an oxide layer that is essentially free of microcracking, the axes of the nanopores in the metal oxide are approximately parallel and oriented orthogonal to the plane of the metal substrate surface from which the oxide is grown. However, growing metal oxide film(s) from a surface having a sharply-rounded edge (such as that at the rim of a hole) generally introduces cracking in the film because the axis of the pores must rotate through a large angle (typically 90°) over a short distance. This situation introduces considerable strain into the film and subsequent cracking. This reduces the dielectric quality of the film.

SUMMARY OF THE INVENTION

A microplasma device of the invention includes a microcavity or microchannel defined at least partially within a thick metal oxide layer consisting essentially of defect free oxide. Electrodes are arranged with respect to the microcavity or microchannel to stimulate plasma generation in said microcavity or microchannel upon application of a suitable voltage and at least one of the electrodes is encapsulated within the thick metal oxide layer. Large arrays can be formed and are highly robust as lack of microcracks in the oxide avoid dielectric breakdown.

BRIEF DESCRIPTION OF THE DRAWINGS

FIGS. 2A-2C are schematic cross-sectional views that illustrate a preferred fabrication process for fabricating arrays of metal oxide microcavity or microchannel plasma devices with substantially defect free oxide in accordance with the invention;

FIGS. 2D-G are a sequence of cross-sectional diagrams illustrating a preferred embodiment process for fabricating one or more microcavities with walls and rims essentially consisting of defect-free metal oxide.

FIGS. 6A and 6B are schematic cross-sectional views of a preferred embodiment microcavity or microchannel plasma device of the invention;

FIGS. 8A-8B are cross-sectional schematic diagrams of a single microchannel and an array of six parallel microchannel devices of the invention, and FIG. 8C is an SEM image of a single microchannel of an experimentally formed array consistent with FIGS. 8A and 8B;

FIGS. 9A-9C illustrate a preferred embodiment formation method of the invention and typical dimensions of two preferred embodiment microcavities (with an associated electrode) of the invention;

DETAILED DESCRIPTION OF THE PREFERRED EMBODIMENTS

Figure 1:
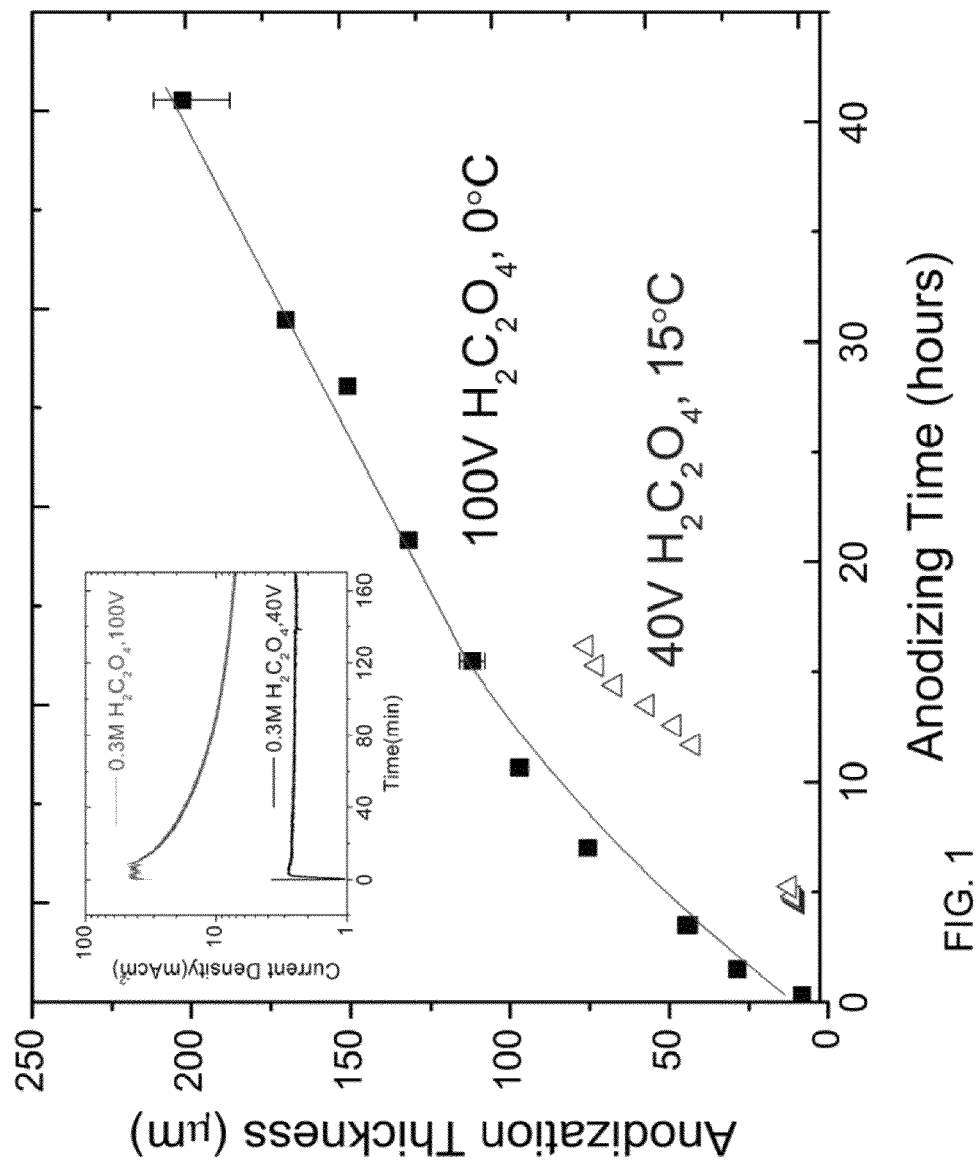
FIG. 1 illustrates film thickness versus anodizing time for a preferred embodiment fabrication process in which nanoporous alumina films are grown in oxalic acid ($H_2C_2O_4$) at different temperatures and anodization voltages.

A microplasma device of the invention includes a microcavity or microchannel defined at least partially within a thick metal oxide layer consisting essentially of defect free oxide. Electrodes are arranged with respect to the microcavity or microchannel to stimulate plasma generation in said microcavity or microchannel upon application of a suitable voltage and at least one of the electrodes is encapsulated within the thick metal oxide layer. Large arrays can be formed and are highly robust as an absence of microcracks in the oxide serves to prevent dielectric breakdown. A method of fabricating a microcavity or microchannel plasma device of the invention includes anodizing a flat or gently curved or gently sloped metal substrate to form a thick layer of metal oxide consisting essentially of nanopores that are perpendicular to the surface of the metal substrate. Material removal is conducted to remove metal oxide material to form a microcavity or microchannel in the thick layer of metal oxide. Powder blasting is preferably used as an efficient removal process that preserves oxide quality.

Preferred embodiment arrays of microcavity and microchannel plasma devices of the invention are formed from metal electrodes buried in substantially defect free metal oxide. In a method of fabrication of the invention, thicker, high quality nanoporous oxide is formed on a flat or gently curved or sloping substrate having a substantial thickness for conversion to oxide. In preferred embodiments, the formed oxide layer is at least 100 μm thick, and the substrate used for fabrication is at least 150 μm in thickness. The nanopores are automatically oriented perpendicularly to the plane of the metal substrate. The microcavities are then formed in the thick, high quality oxide by an oxide material removal technique such as laser ablation or powder blasting. A preferred method uses powder blasting to form microcavities or microchannels, via techniques previously applied to substrates such as glass, polymers and ceramics as disclosed in Eden et al. U.S. Published Patent Application No. 2010/0072893, entitled Ellipsoidal Microcavity Plasma Devices and Powder Blasting Formation, which is incorporated by reference herein.

Methods of the invention provide for the fabrication of microcavities and microchannels, and arrays thereof, in one or more layers of nanoporous metal oxide of high quality. The term "high quality" indicates that the metal oxide layer is essentially free of microcracking, i.e., the metal oxide consists essentially of oxide with no microcracks. Tests have shown that the dielectric breakdown strength of nanoporous alumina ($Al_2O_3$) films, for example, can be several times larger than that for bulk alumina.

In methods of the invention, a metal oxide layer is grown on a flat or gently sloped or curved surface. A gently curved or sloped surface is one that has no irregular surface features or steep or sudden transitions, such as edges and surface protrusions or cavity rims. An irregular surface protrusion is one that is more than ~10-20% in height of the thickness of the metal oxide that will be formed. A steep or sudden transition is one that has a local radius of curvature of less than approximately 1 mm. Microcavities and/or microchannels are formed subsequently in the metal oxide layer. This approach ensures that the oxide (in which the cavities are to be formed) is essentially free of cracking and, therefore, avoids premature electric breakdown of the dielectric.

Arrays of microcavity plasma devices of the invention are formed from a metal/metal oxide system, such as the $Al/Al_2O_3$ system, but micropowder blasting, laser ablation or another controlled oxide removal technique forms microcavities in thicker, higher quality layers of nanoporous metal oxide. Preferred methods of the invention also provide an optimized process that accelerates oxide growth rate, even at low temperatures, to provide high quality oxide.

As discussed above, an important advantage of the present invention over our prior work, including that discussed in the background, is that the metal oxide, e.g. aluminum oxide ($Al_2O_3$), surface is substantially free of cracks and other defects produced by growing $Al_2O_3$ on sharply-rounded or discontinuous surfaces. The thick layers of nanoporous metal oxide grown by the optimized process on a flat or gently curved or sloping surface produces a defect-free layer of the metal oxide. Subsequently, the microcavities are formed by micro- or nano-powder blasting (or other technique such as laser ablation). Thus, the emphasis is on obtaining a defect-free oxide film first and the cavity shape second. Surprisingly, such higher quality oxide layers, which can also be substantially thicker, yield microcavity plasma device arrays that are considerably more resilient to electrical breakdown and can, therefore, better tolerate harsher operating environments, such as would be experienced in ozone generation (for water treatment) and for the treatment or decomposition of gases such as $CO_2$ or $NO_x$. Arrays of microcavity plasma devices of the invention are exceptionally robust and have dielectric essentially consisting of defect-free, thick metal oxide.

Preferred materials for the thin metal electrodes and metal oxide are aluminum and aluminum oxide ($Al/Al_2O_3$). Another exemplary metal/metal oxide material system is titanium and titanium dioxide ($Ti/TiO_2$). Other metal/metal oxide material systems will be apparent to artisans. Preferred material systems permit the formation of microcavity plasma device arrays of the invention by inexpensive, mass production techniques such as roll-to-roll processing.

Preferred embodiments will now be discussed with respect to the drawings. The drawings will include schematic figures that are not to scale, which will be fully understood by skilled artisans with reference to the accompanying description. Features may be exaggerated for purposes of illustration. From the preferred embodiments, artisans will recognize broader aspects of the invention. The preferred embodiments will be illustrated with respect to the preferred $Al/Al_2O_3$ materials system, and experiments that were conducted to form experimental devices. As mentioned above, other metal and metal oxide systems can be used.

A fabrication process of the invention commences with a substantially flat or gently curved or sloped metal substrate (plate, foil, film, rod, etc.) that has a thickness sufficient to provide a thick oxide layer, such as a 100 μm or thicker oxide layer. The flat or gently curved or sloped metal substrate has no pre-formed microcavities, and provides a flat, continuous, uninterrupted surface on which a thick layer of metal oxide will be grown. FIG. 1 illustrates conditions for a preferred embodiment fabrication process that has been tested in experiments. and that provides insight into the optimal growth conditions for rapid formation of thick metal oxide layers. Prior arrays of microcavity plasma devices in metal and metal oxide have been formed with an anodization of a thin metal film with pre-formed microcavities in a temperature range of about 25° C.-50° C. The temperature used in anodization in the present method is preferably below 15° C. and preferably within a couple degrees of 0° C. In addition, in a preferred embodiment, the voltage during anodization is preferably above 40 V and is up to about 150 V.

The particular data in FIG. 1 show that, for an anodization process conducted experimentally in which oxalic acid ($H_2C_2O_4$) converts aluminum into $Al_2O_3$, we have been able to dramatically accelerate the growth of $Al_2O_3$ while actually lowering the growth temperature substantially, e.g., down to 0° C. or a couple of degrees lower. Note that, for 40 V, the growth rate is substantially slower than that for anodizing voltage of 100 V, even though the bath temperature has been raised to 15° C. The inset shows that the primary electrical effect of raising the processing voltage is to increase the current density. In this manner, $Al_2O_3$ films of extraordinary thickness can be grown on aluminum substrates such as a plate or thick foil. The thick, e.g., ~100 μm-500 μm and beyond, metal oxide films grown in this way are nanoporous and virtually defect-free. That is, the film has no cracks that can lead to electrical breakdown when the metal oxide film serves as a dielectric.

FIGS. 2A-2C illustrate a preferred fabrication process in accordance with the invention. The first step in FIG. 2A entails the growth of nanoporous metal oxide 10 around a metal substrate 12 by anodization, preferably at the low temperatures and high voltages discussed above. The low temperatures and high voltages maximize rate of film growth while preserving quality, but high quality films can be formed more slowly outside of the preferred low temperatures and high voltages. This results in metal oxide thicknesses of tens to hundreds of μm, and preferably at least about 100 μm. Previous techniques mentioned in the background have grown thin oxide layers in a pre-anodization step for the purpose of controlling microcavity shape in a subsequent chemical process.

FIG. 2B illustrates the second step in this process, which is the placement or formation of a mask 14 on the surface of the anodized substrate. The mask may simply be a metal mesh or grid but preferably has its lifetime extended by coating the mesh with a polymer film (such as a film of UV-curable polymer). Such a mesh or grid provides a low cost means for defining the locations of the desired microcavities. The mesh can have a complex shape with many microcavities, and can be formed in accordance with a preferred process that has been previously applied to forming microcavities in glass and polymer substrates as disclosed in Eden et al. U.S. Published Patent Application No. 2010/0072893. FIGS. 2A-2C of that published application form a mask by covering a metal mesh with an ultraviolet (UV) curable ink that has been found to be resistant to the microblasting process. The ink is preferably a polymer having relatively low viscosity.

With the mask in place, microcavities 16 or microchannels 21 are produced in FIG. 2C by powder blasting, either micropowder or nanopowder blasting. A nozzle or nozzles 17 spray the abrasive powder 19 to remove metal oxide material. As seen in FIG. 2C, the cavities formed by the powder blasting have a generally half-ellipsoid cross-sectional shape. The cross-sectional profile of the microcavities 16 is determined by several factors, including the backing pressure and the size of the powder particles used in the powder blasting process. Example powders include those consisting of $Al_2O_3$, $SiO_2$, SiC or metal carbonates. The size of the particles in these powders is between about 500 nm and 30 μm. Other techniques, such as laser ablation, can be effective in forming microcavities. It is noted that the mask can be used but is not required if laser ablation is used for forming the microcavities. Without a mask, the laser spot can be electronically controlled to ablate material at specified locations.

Figure 2D:
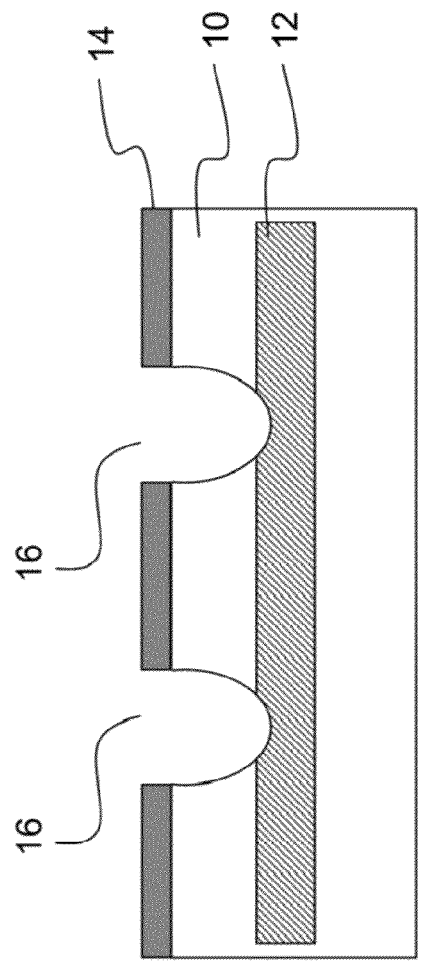
Figure 2E:
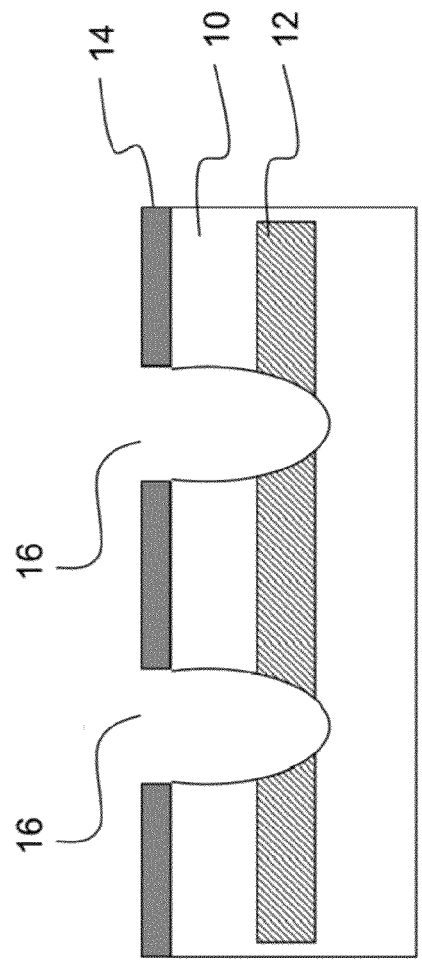

If the initial $Al_2O_3$ layer grown in FIG. 2A is sufficiently thick, then the microcavity 16 may be formed only in this alumina layer as shown in FIG. 2C. Alternatively, as illustrated in FIG. 2D, the cavity may extend into the underlying metal (presuming, of course, that the $Al \rightarrow Al_2O_3$ conversion of Step 1 [FIG. 2A] did not completely convert the Al metal into oxide). FIG. 2E illustrates another variation in which the powder blasting continues until it penetrates completely through the metal 12, which can serve as a device electrode. The powder blasting is also able to ablate completely through the metal oxide 10 and metal layer 12 so as to form an aperture 18 at the bottom of the microcavity 16, as shown in FIG. 2F.

Depending upon the shape of the mask 14 and the openings therein, as well as the duration of powder blasting, different sized and shaped, but generally elliptical cross-section microcavities can be produced. Similarly, microchannels with half-elliptical cross-sections can be produced. In the processes of FIGS. 2D-2F, wherein the metal is completely or partially penetrated by the microcavity 16 or microchannel, a second anodization can be performed to convert the exposed surface of the metal 12 (as in FIGS. 2D, 2E, and 2F) to metal oxide, and thereby protect the metal 12 that can serve as a device electrode for plasma generated in microcavities or microchannels 16. This is shown in FIG. 2G, which also shows the mask 14 removed. Metal oxide 10 lines the internal walls of the microcavity or microchannel to protect the metal electrode 12. The additional metal oxide supplied by the second $Al_2O_3$ growth (the portion of metal oxide 10 lying between the interior edges of metal 12 and the microcavity wall) retains the smooth surface of the microcavity wall and this fresh oxide does not crack because the contour of the metal surface exposed to the wet chemical etching process varies gradually. The quality of the metal oxide layer produced by the second anodization is important to the electrical reliability of the finished device or array of devices. The slowly-changing slope of the electrode faces in FIG. 2G (i.e., the ends of the electrode 12 terminating at the cavity wall prior to the second anodization) facilitates the growth of oxide that essentially consists of oxide that is free of microcracks. FIG. 2G also illustrates a gentle curve 17 that can be formed at the top of microcavities and microchannels by methods of the invention. This gently-rounded rim 17 is a result of undercutting the oxide beneath 14 (not seen in FIG. 2G) by the powder-blasting process.

Figure 3:
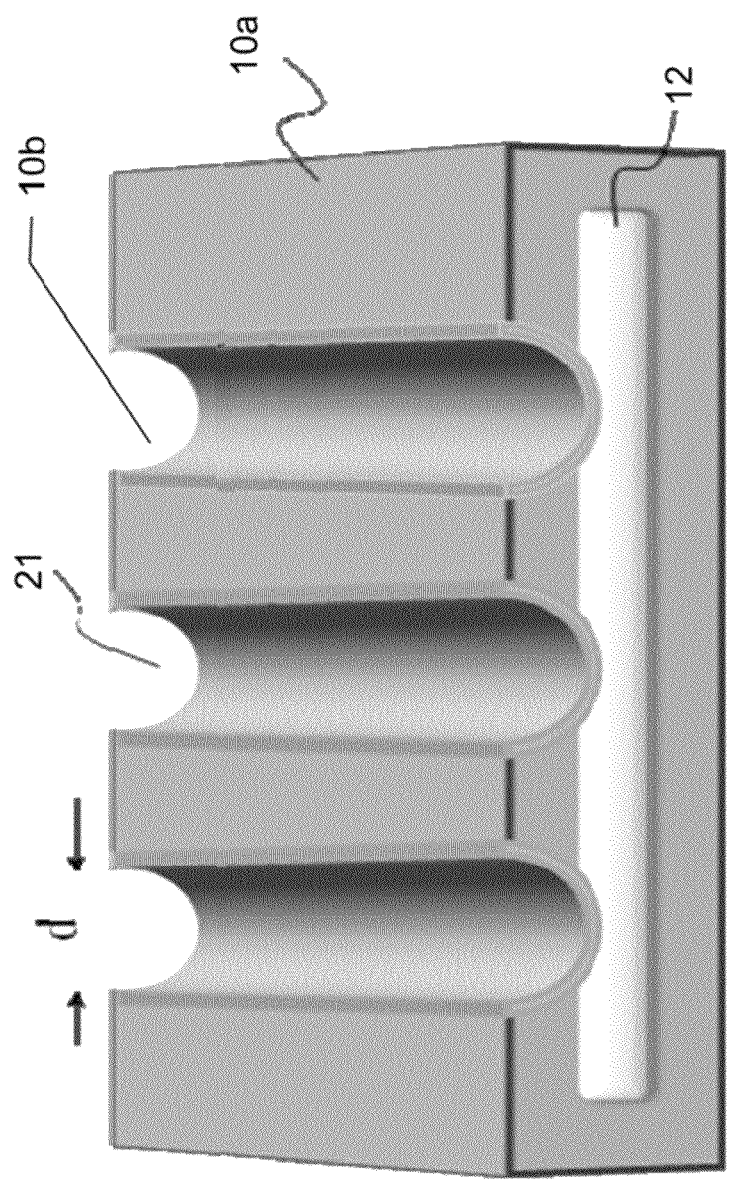
FIG. 3 is a perspective view of a preferred embodiment of an array of microchannel plasma devices in accordance with the invention.

FIG. 3 shows an array of microchannel plasma devices. While three microchannels 21 are illustrated, much larger arrays can be formed. Other features of the array in FIG. 3 are labeled with reference numbers used in previous figures to indicate similar features in FIG. 3. Each of the microchannels 21 has an elliptical or quasi-circular cross-section, and the shape of the microchannels 21 is readily produced by nanopowder blasting.

The transverse dimension d of the microchannels can range from nominally 1 μm to 1 mm, but preferably is in the 20-500 μm interval. Metal oxide 10a is produced, for example, from the original Al material and microchannels 21 are produced in a first oxide layer 10a by powder blasting, laser ablation or another suitable technique. If desired, a barrier film 10b can be deposited on the walls of the microchannels 21.

Figure 4:
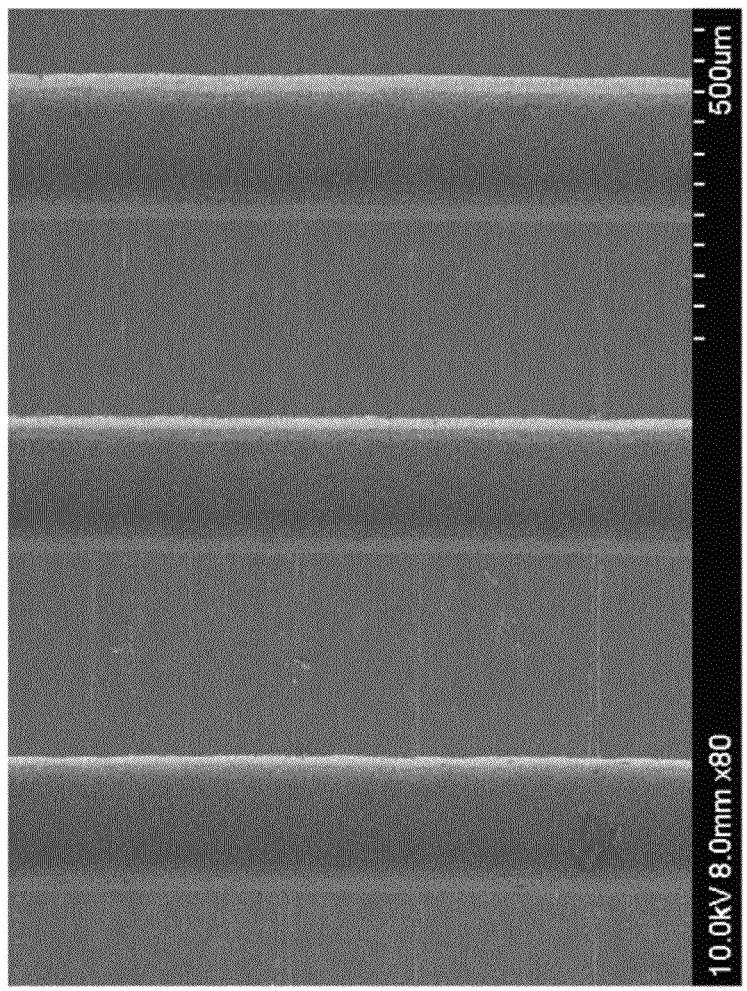
FIG. 4 is a scanning electron micrograph (SEM) image in plan view (i.e. from above) of a portion of an array of parallel microchannels, ~220 μm in width, that were formed in experiments and that illustrate a preferred embodiment of the invention.

FIG. 4 is a scanning electron micrograph (SEM) in plan view of three microchannels in a larger array that was formed experimentally via oxidation, powder blasting and further oxidation in accordance with the array illustrated in FIG. 3. The microchannels in the experimental device have a width (at the surface of the channel) of ~220 μm.

Figure 5:
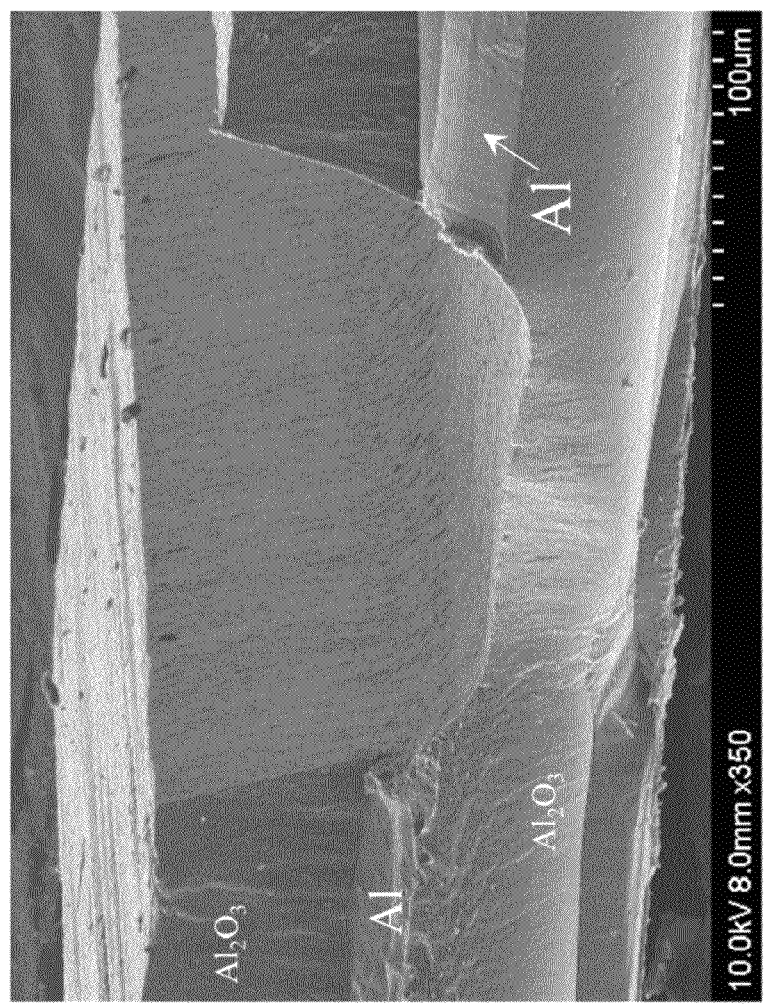
FIG. 5 is an SEM image of a portion of an $Al_2O_3$ microchannel, of the invention.

FIG. 5 is an SEM showing a portion of an array formed in accordance with another preferred embodiment of the invention in which the microchannel has the form of a trench with a substantially flat bottom. The $Al_2O_3$ layers above and below the Al electrode can be seen in FIG. 5. Controlling the microchannel cross-section can be accomplished by controlling three primary variables, including, the mean size of the particles used in powder blasting, the size of the mask apertures, and the interaction time of the powder blasting jet with the oxide being blasted. Obtaining microchannels or microcavities with flat bottoms generally requires particles that are smaller in size than those used to produce rounded bottom microchannels and microcavities. The flat bottom microchannel of FIG. 5 was fabricated with particles having a mean size of 17 μm while the width of the microchannel (and approximate size of the mask aperture) was 200 μm. Narrow mask openings and larger particles tend to produce microchannels and microcavities with rounded bottoms.

Figure 6B:
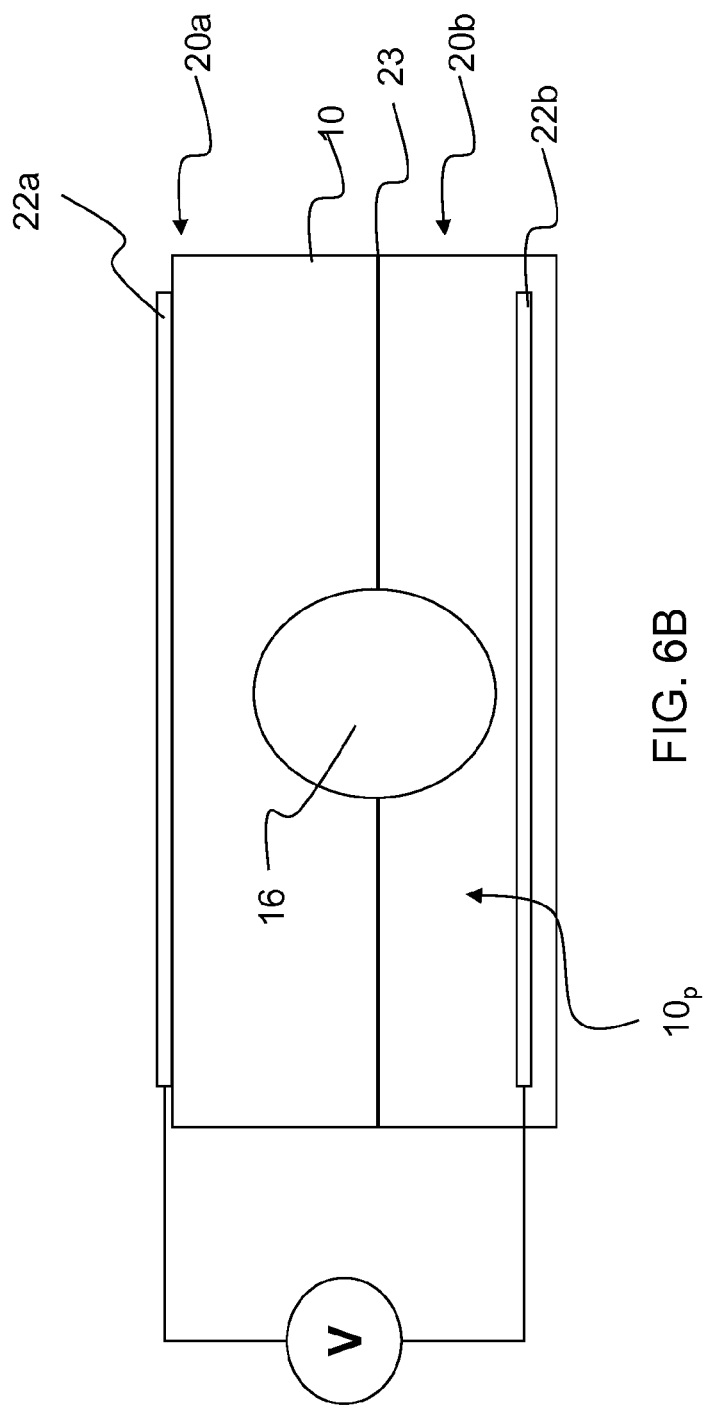

In preferred embodiments, a single device or an array of devices is completed by joining a second layer, having the same structure as that of the first layer (as exemplified by FIG. 2), to the first layer such that the microcavities or microchannels in both layers are intentionally aligned or, if desired, offset. FIG. 6A shows an embodiment where two identical layers 20a and 20b with thick, high quality oxide 10 are joined such that microcavities or microchannels 16 or 21 are aligned to form a combined channel and the encapsulated metal forms separate electrodes 22a, 22b. FIG. 6B shows a variation in which one of the electrodes 22a is formed on the top of the second dielectric layer 20a. In this case, the second dielectric layer 20a can be, for example, a glass or ceramic substrate that is bonded to the thick oxide of the layer 20b with adhesive 23, e.g. glass frit. FIG. 6B also schematically illustrates nanopores $10_p$, which form automatically from the present methods of fabrication and are oriented perpendicularly to the plane of the metal substrate.

Figure 7:
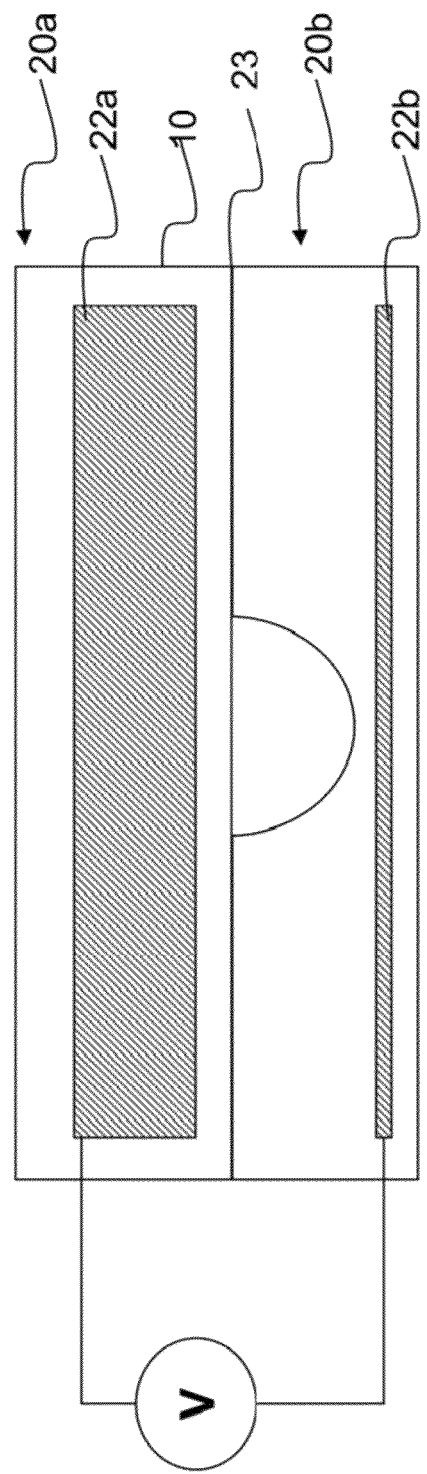
FIG. 7 is schematic cross-sectional view of a preferred embodiment microcavity or microchannel plasma device of the invention.

FIG. 7 shows another embodiment in which the layer 20a has no microcavities or microchannels. In addition, the layer 20a can be formed of another material, such as glass or ceramic that is bonded to the metal and metal oxide layer 20b. The layers can be joined by an adhesive 23 or another suitable bonding material that is resilient, even in the presence of a plasma medium. A DC driven variation of FIG. 7 is possible if the electrodes 22a and 22b are not encapsulated in dielectric as illustrated in FIG. 7, which may occur, for example, if the top layer 20a is a thin sheet of glass and the microcavity or channel was formed to expose the electrode 22b without a subsequent formation of a second oxide layer. In that case, the second electrode 22a can simply be a thin ITO film on the glass sheet.

However, in preferred embodiments, electrodes are completely isolated from the microcavities or microchannels to protect the electrodes from plasma generated therein. In such preferred embodiments (as illustrated in FIGS. 2-7), for production of a microplasma, a time-varying voltage waveform V is applied between the two electrodes 22a, 22b. In a structure like that shown in FIGS. 2D-2F, if an electrode is not covered with metal oxide by a second anodization process, then two electrodes can be driven with a DC voltage, but this DC driving mode is possible only if both electrodes are exposed to the plasma. Generally, it is preferred to protect the electrodes with oxide, as the plasma will etch the exposed metal electrodes.

FIGS. 8A-8C illustrate in cross-section an array of microchannel plasma devices having the general arrangement of FIG. 7 with the flat bottom microchannel structure of FIG. 5 (fabricated as an experimental device) with an SEM image of a single microchannel being shown in FIG. 8C. The dimensions of the experimental array are labeled in FIGS. 8A and 8B. The trench-type channels had a depth of 115 µm and a breadth of 220 µm at the top of the channel and were fabricated by the processes described above with respect to FIG. 2. The electrode 22a powering the microchannel plasmas is separated from the wall of the channel by 10 µm. The example array had six microchannels, as shown in FIG. 8B. The final thickness of the sealed structure was 360 µm and the width of the array was 20 mm.

In the above arrays, regardless of whether the microcavity 16 or microchannel 21 is confined to the oxide 10 or extends into a metal substrate 12 or not, a critical aspect of this invention is that the sharp edge produced between the oxide surface and the microcavity sidewall is produced in an already existing layer of high quality (defect-free) $Al_2O_3$. This is important because the micropowder blasting process or comparable material removal process does not significantly damage the nanoporous structure of the oxide as it forms the cavity. In the previous work discussed in the background, the microcavity is formed first (by a variety of methods) and then the oxide was grown. Such processes require the growth of the oxide over a reasonably sharp edge which presents a problem because the axes of the hexagonal nanopores in nanoporous $Al_2O_3$ are always oriented orthogonal to the surface on which the oxide is grown. This means that if one grows $Al_2O_3$ around a sharp "corner", the axis of the pores rotates rapidly and requires a pitch (center-to-center spacing) between the pores that is much larger at the surface of the $Al_2O_3$ film than it is at the base of the film (i.e., at the $Al/Al_2O_3$ interface). Attempting to do this produces considerable stress in the $Al_2O_3$ film which can result in cracks. Such cracks can lead to electrical breakdown when one generates plasma in the microcavities. One way to ameliorate this difficulty was to coat the $Al_2O_3$ films with thin films of glass, which also flowed into the cracks. This is effective, but glass does not have the dielectric properties of $Al_2O_3$ so using glass negates, to some extent, the value of employing nanoporous $Al_2O_3$.

A wide variety of dimensions can be achieved in arrays of the invention. Example dimensions are presented now with respect to the labels in FIGS. 9B and 9C. FIGS. 9A-9C also illustrate the steps in a fabrication process, as well as a resultant microcavity or microchannel device similar to that of FIG. 2F which has a small aperture at the base of the microcavity. A starting Al foil thickness in FIG. 9A is in the range of ~0.03-3 mm. Anodization is typically conducted in 0.3M oxalic acid with a 40V-150V voltage at 1° C. for ~3-12 hours. In FIG. 9B, a microcavity or microchannel is formed, typical dimensions after powder blasting are: ~0.05-5 mm; b: ~0.05-5 mm; c: ~0.01-0.5 mm; d: ~0.01-5 mm; and e ~0.005-0.2 mm. In FIG. 9C, after a second anodization using the same conditions, typical dimensions are a: ~0.05-5 mm; b: ~0.05-5 mm; c: ~0.01-0.5 mm; d: ~0.01-5 mm; e; ~0.001-0.2 mm; and f: ~0.01-0.2 mm. The $Al_2O_3$ thickness between the Al electrode edges and the microcavity wall is typically between 10 µm and 200 µm. An additional layer similar to the upper layers in FIGS. 6-8 is required. The two electrodes are driven by a time-varying voltage and the microchannel is filled with a gas or gas mixture to serve as a plasma medium.

Figure 10A:
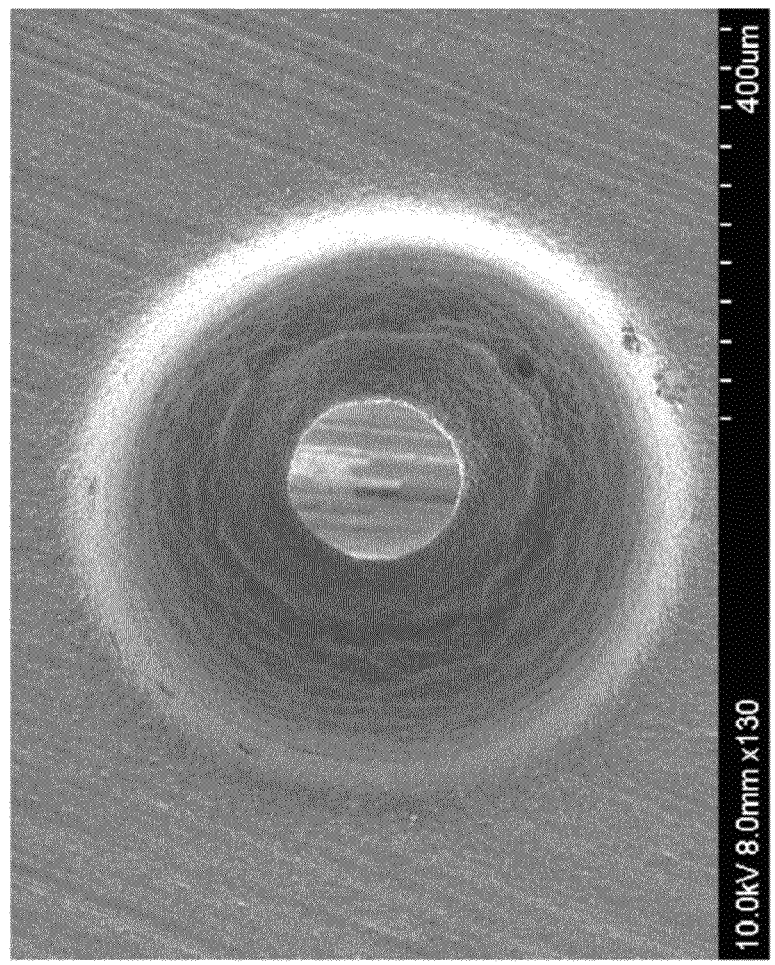
FIGS. 10A-10C are SEMs of one or more microcavity plasma devices of the invention that have been fabricated.
Figure 10B:
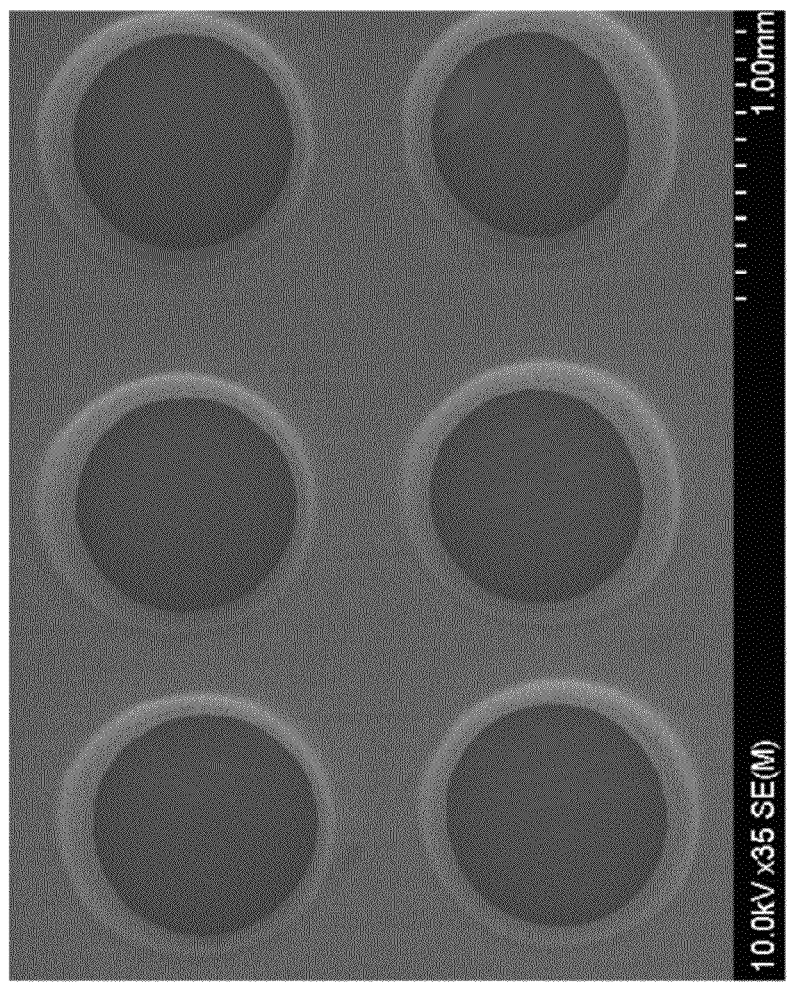

FIGS. 10A and 10B show scanning electron micrographs (SEMs) of several microcavities that were micromachined into $Al_2O_3$ by powder blasting in accordance with the invention. FIG. 10A is an SEM in plan view of a single cavity having an upper aperture ~400 µm in diameter whereas the rear opening is ~160 µm. The rounding at the top opening of the microcavities is readily apparent. FIG. 10B shows a segment of an array of cavities with an upper aperture of 1.0 mm and a lower (rear) aperture that is only slightly smaller (0.8 mm or 800 µm). As seen in the images, the entire wall of the microcavity from the upper surface of the $Al_2O_3$ layer, over the rim, and along the sidewalls—is free from cracking. Also, it is clear that the transition from the flat $Al_2O_3$ upper surface to the sidewall has been rounded ("smoothed"). This is highly advantageous with regard to the lifetime of these devices. The devices of this invention are extremely robust.

Figure 10C:
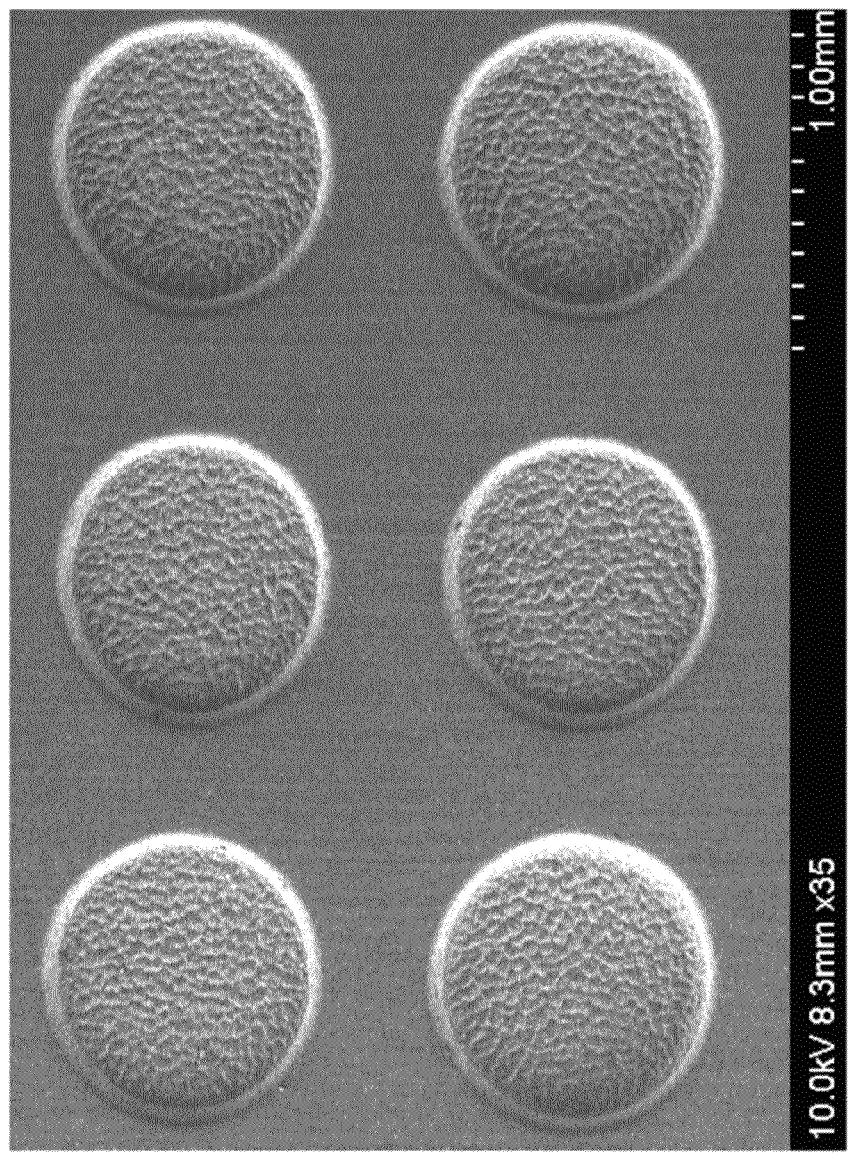

FIG. 10C is an SEM (in plan view) of a portion of an array of microcavity plasma devices of the invention. The cylindrical microcavities have a diameter of ~1 mm and substantially flat bottoms. The entire interior of each microcavity is lined with nanoporous $Al_2O_3$.

Figure 10D:
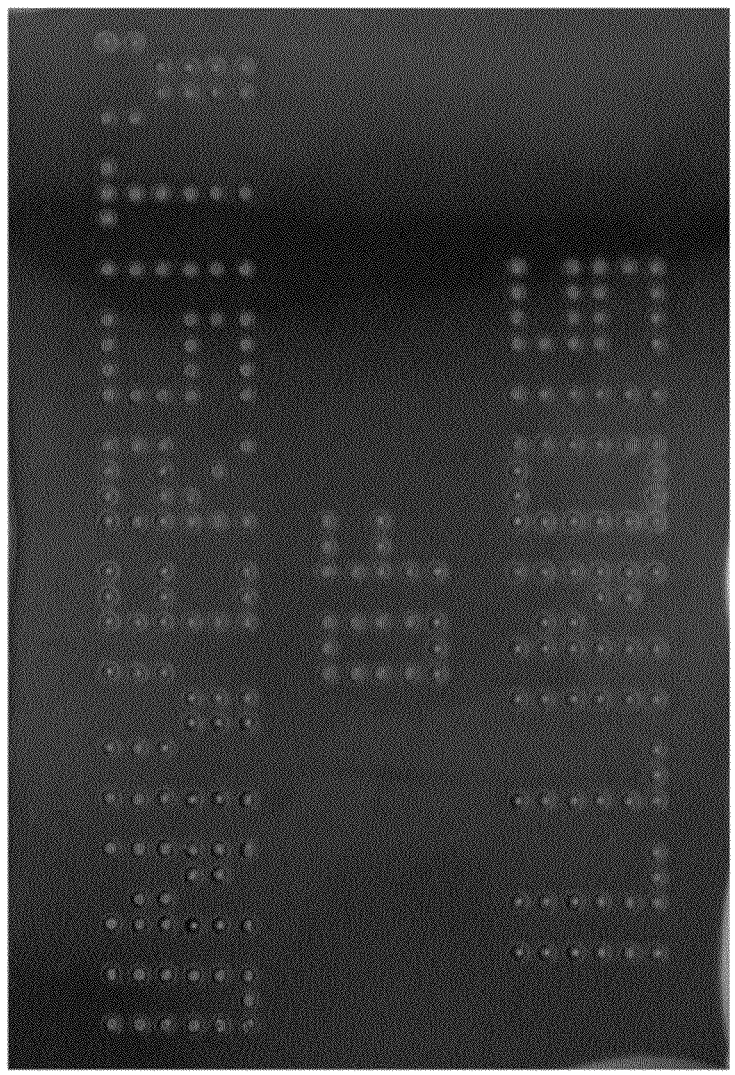
FIG. 10D is a photograph showing an array of microcavity plasma devices of the invention, producing diffuse glows (i.e. arc and streamer free) in atmospheric air and showing clear individual emissions from microcavities in a pattern that spells "UNIVERSITY OF ILLINOIS"

An array of devices of the invention was fabricated and is shown in FIG. 10D. The photograph was taken of an array of $Al_2O_3$ microplasma devices of the invention operating in laboratory air. Operation of any plasma in air is generally difficult because oxygen ($O_2$) is strongly attaching. This means that $O_2$ rapidly absorbs electrons from a plasma, making it extremely difficult to sustain the plasma. Consequently, discharges in air are generally arcs or streamers (such as lightning bolts), as opposed to a diffuse glow discharge. Because of the size of the cavities in FIG. 10 and the structure of FIGS. 6-9, the microplasmas of FIG. 10 are diffuse glows.

Arrays of the invention lend themselves to many important applications, including the efficient production of ozone ($O_3$) for water disinfection and treatment (deodorization, decoloration). Preliminary experiments show clearly that this is quite feasible by flowing air or $O_2$ through arrays of microchannels such as those of FIGS. 2G, 8 and 11. The arrays, with thick, high quality oxide, are readily stacked as modules. Forcing air or $O_2$ to travel through the intense microplasmas converts a fraction of the $O_2$ feedstock gas into ozone. The number and spacing between the arrays can be varied so as to optimize the efficiency with which ozone is generated.

Figure 11:
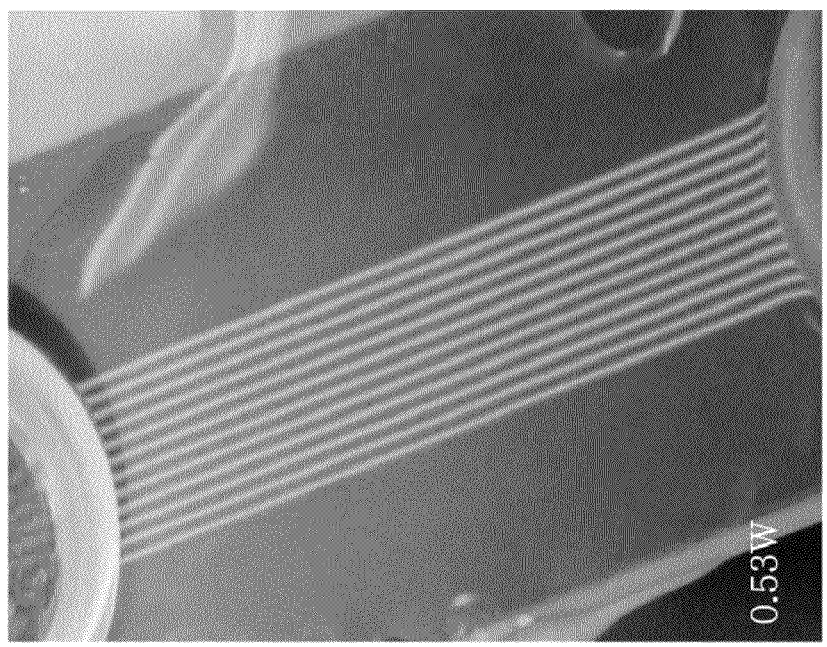
FIG. 11 is a photograph in plan view of an ozone microreactor that was fabricated according to an embodiment of the invention, comprising 12 microchannels through which oxygen ($O_2$) was flowed at a rate of 0.5 standard liters per minute.

FIG. 11 is a photograph of a prototype ozone generator comprising 12 microchannels through which $O_2$ feedstock gas flows at a total flow rate of 0.5 standard liters per minute (slm). The structure of this array is similar to that of FIG. 3. It is clear from the photograph that the discharge is a uniform, diffuse glow over the full length of the reactor. Data acquired to date with this and literally score of similar reactors shows that $O_3$ generation efficiencies in excess of 150 g/kWh are obtained, despite the fact that the microchannel cross-sectional profile is not necessarily optimized.

In addition, greenhouse gases such as $CO_2$ may be transformed into an industrially valuable feedstock such as ethanol or formic acid by passing $CO_2$ through a series of microplasma arrays. As a portion of $CO_2$ is fragmented (dissociated), it can be reacted (titrated) with water vapor, hydrogen or other gases or liquids so as to form gases and liquids of industrial value. This can be accomplished in stages in which the desired product is removed after each stage of microplasma action, and fresh reactant ($CO_2$) added to the flow-stream.

Figure 12:
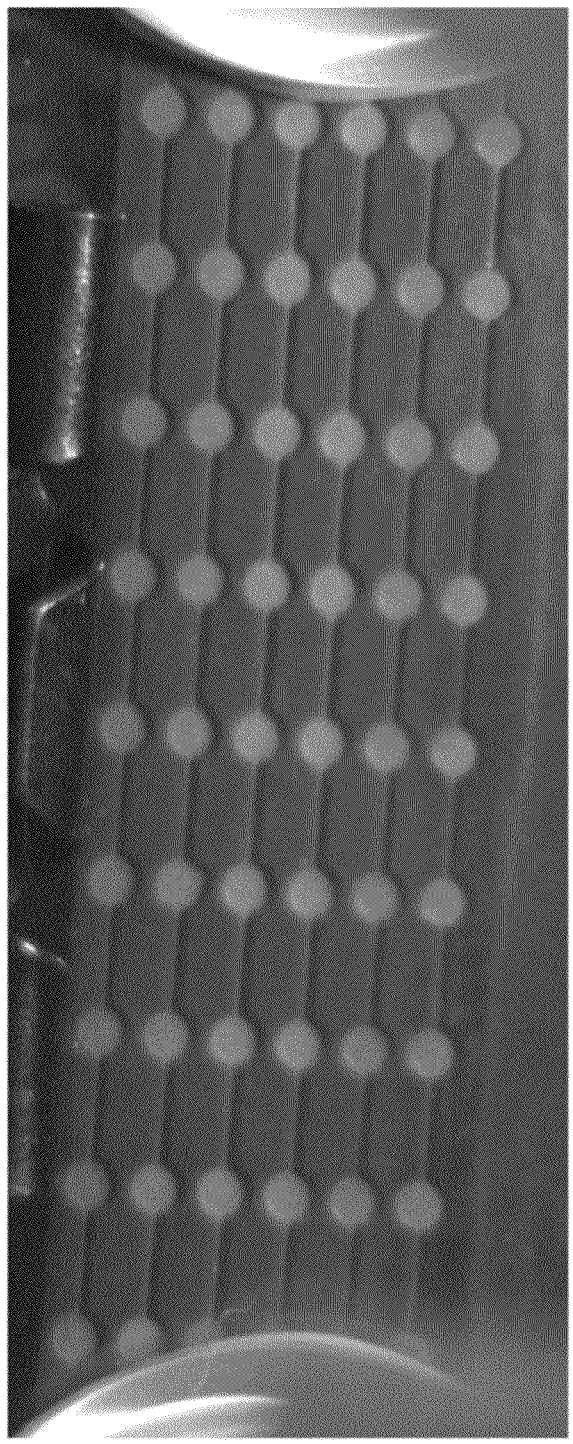
FIG. 12 is a photograph of a hybrid cylindrical microcavity/linear microchannel array, fabricated in $Al/Al_2O_3$, in accordance with the invention.

The geometry of the cavities that can be formed is quite broad. For example, the mask for the micropowder blasting process can be designed so as to result in the fabrication of microchannels, as illustrated in FIGS. 3 and 8. Note that the electrode can extend the full length of each trench or, if desired, the electrode can be "modulated" so as to have a sequence of electrodes of length L and separated by a desired distance. This is accomplished by interrupting the electrode. In this way, virtually any pattern of electrode structure can be fabricated in a metal/metal oxide system of the invention Furthermore, the channels of an array need not themselves be uniform along their entire length. For example, FIG. 12 is a photograph of a six channel microreactor fabricated in $Al/Al_2O_3$. In this embodiment of the invention, the linear channels are punctuated by circular cavities interspersed at regular intervals along the channel. The plasma parameters in the circular cavities differ from those in the narrow, linear channels, and their volumes are not only intended to affect the microplasma chemistry but also to provide significant light emission so as to serve as a diagnostic of the reactor chemistry.

Figure 13:
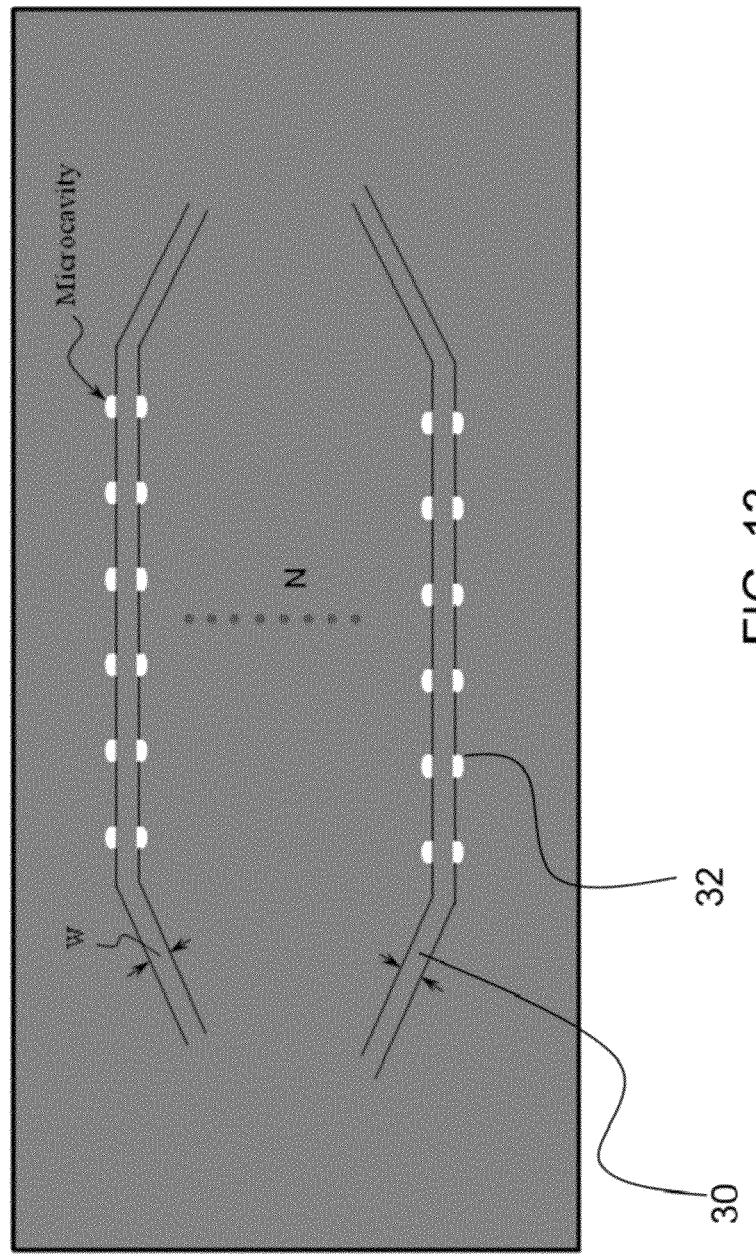
FIG. 13 is a schematic diagram that illustrates a preferred, N+2 channel microreactor geometry based upon microcavity plasma devices of the invention.
Figure 14:
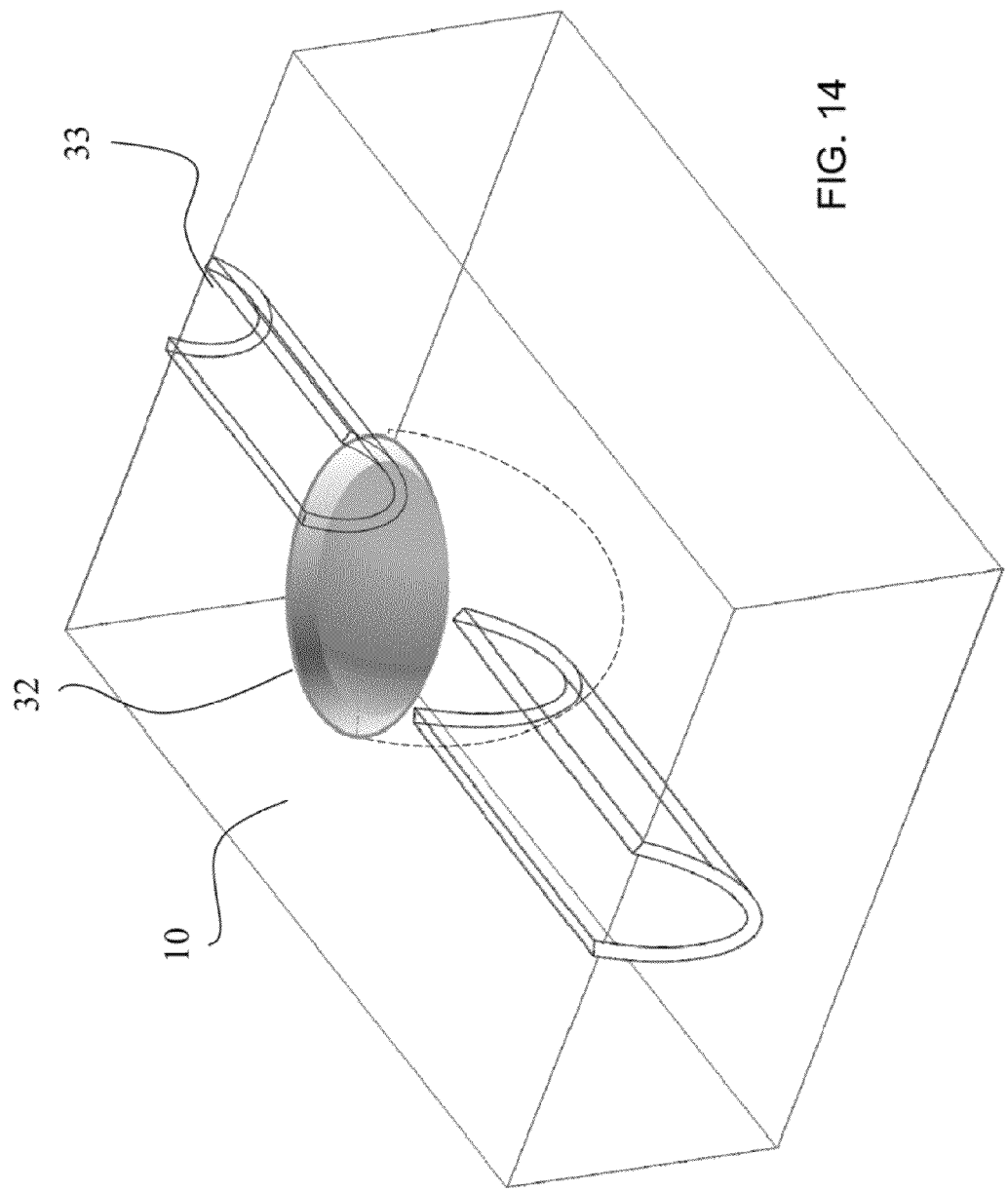
FIG. 14 is a perspective schematic view of a preferred embodiment microplasma device from the microreactor of FIG. 13.

FIG. 13 illustrates a preferred microreactor geometry based upon microcavity plasma devices of the invention. In this embodiment, N+2 reactor channels (each having a width W) are formed. Although not illustrated in FIG. 13, the N+2 channels will generally have a common gas inlet and may also merge at the outlet. At plural points along the length of the channels 30 are situated microcavity plasma devices 32 of the invention. The plasma devices 32 can have, as one example, the structure shown in FIG. 14. Micropowder blasting is able to form a cavity 32 into a previously formed microchannel 33 such as that shown in FIG. 14. Earlier, the trench 33 had been fabricated in $Al_2O_3$ grown on Al by micropowder blasting. While not shown in FIG. 14, an encapsulated electrode as in previous figures would be encapsulated in the high quality oxide 10.

Figure 15:
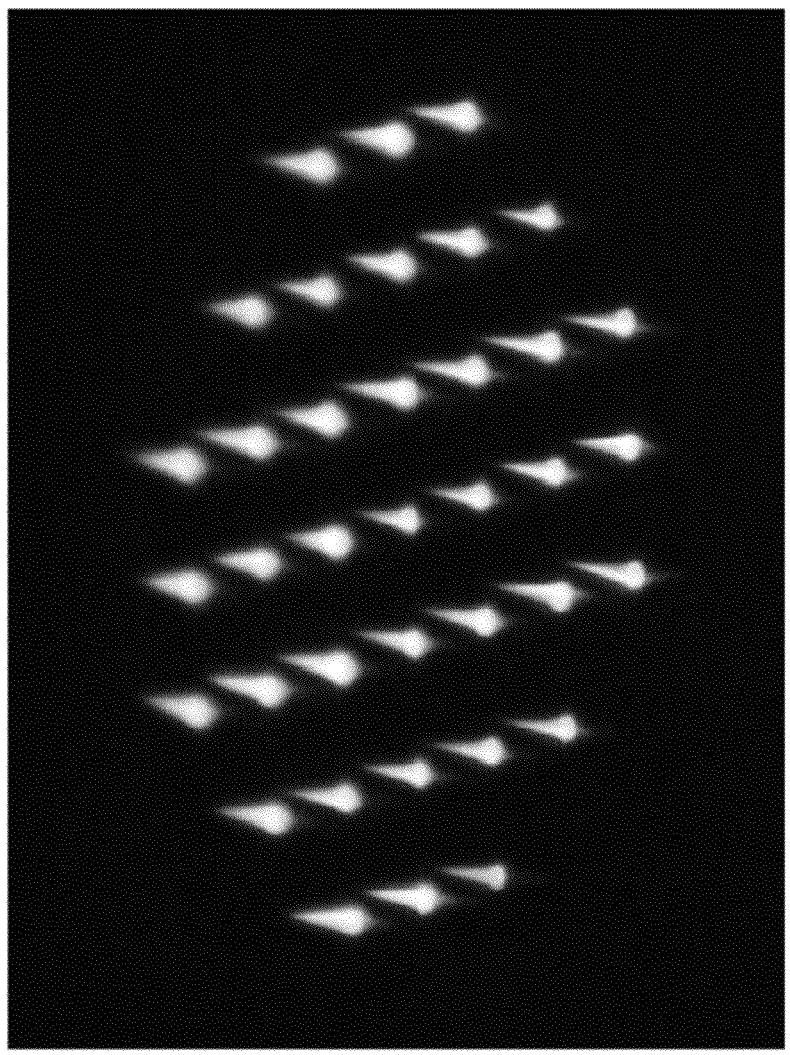
FIG. 15 is a photograph of a 37 element microplasma jet array according to the invention.
Figure 16B:
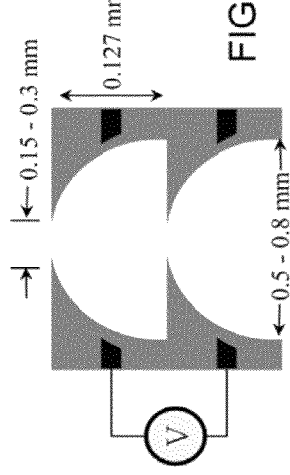
FIGS. 16A-16C illustrate a microplasma jet array structure in accordance with the invention.
Figure 16C:
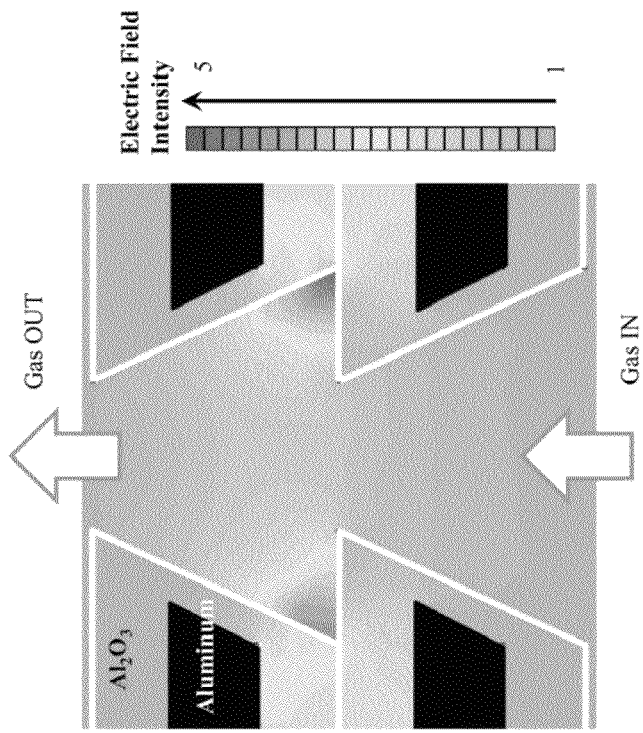
Figure 16A:
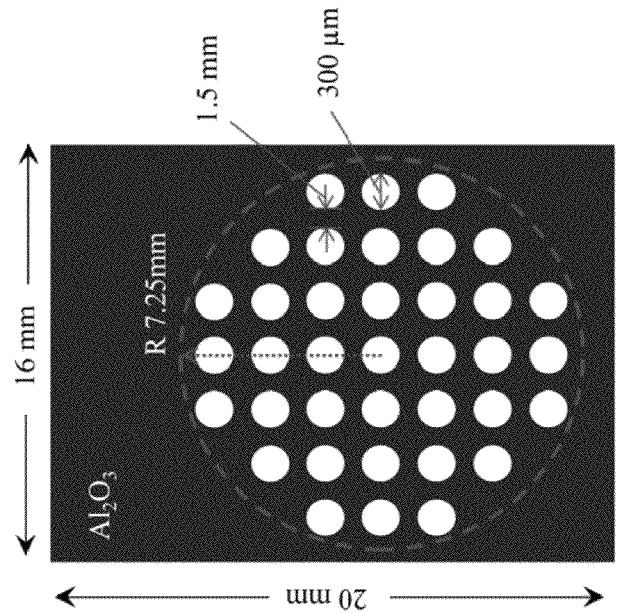

Other exemplary applications of embodiments of the invention pertain to the formation of plasma jets. FIG. 15 is a photograph of an array of 37 microplasma jet devices designed and fabricated according to the invention. Having the cross-sectional design of FIG. 9C, each of the jet devices produces a plasma that extends through the lower aperture of the microcavity (cf. FIG. 9C) and into room air (or whatever gas exists in the region outside the device). The photograph in FIG. 15 shows the plasma jets produced in room air when He l.c. gas is flowed through the jet array (entering from the side of each microcavity with the larger aperture). FIGS. 16A and 16B illustrate the dimensions of an experimental array and FIG. 16C shows the calculated electric field intensity in a plasma jet structure with straight side walls, which were stacked in two layers as shown in FIG. 16B and FIG. 16C. The compact array was sealed to a glass tube that provided a connection to the He (feedstock) gas supply. This embodiment of the invention is well-suited for medical therapeutics such as wound disinfection and blood coagulation. Arrays having a similar configuration to that of FIG. 15 & FIGS. 16A-16C are also of value for providing small amounts of thrust (on the order of milli-Newtons) for maneuvering purposes for "nano-satellites."

Figure 17:
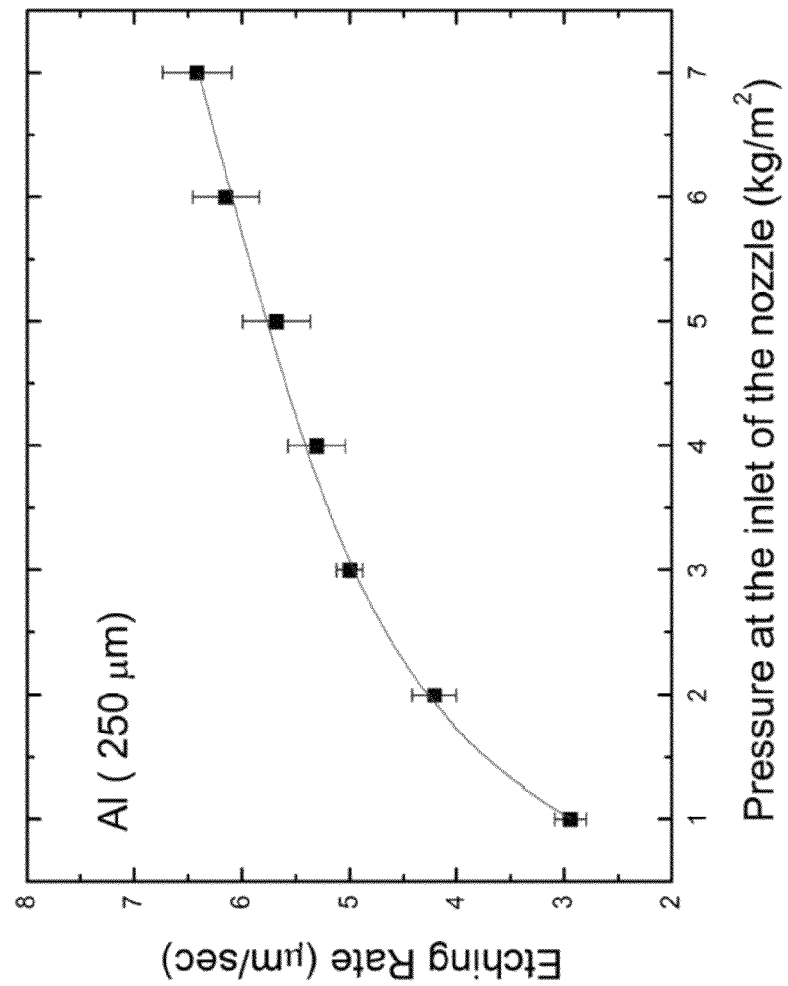
FIGS. 17 and 18 illustrate etching rates achieved with exemplary process of the invention in Al and in $Al_2O_3$ to form microcavities.
Figure 18:
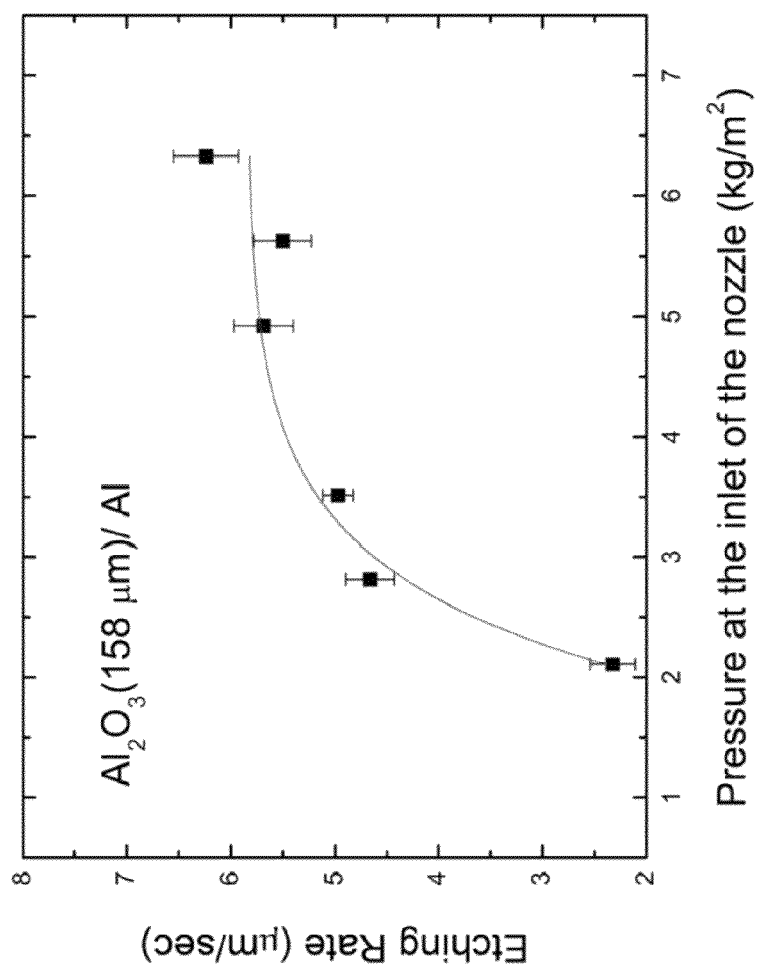

Arrays of the invention can be fabricated quickly and efficiently. FIG. 1 has already demonstrated that thick, high quality $Al_2O_3$ films can be grown much more rapidly than previously. FIGS. 17 and 18 illustrate the etching rates for both Al and $Al_2O_3$ that are achievable with micropowder blasting. The time necessary to etch through 250 µm of Al is shown in FIG. 17 as a function of the backing pressure (psi) on a circular nozzle having a diameter of 300 µm. The mean diameter of the particles in the micropowder flow is 10 µm. FIG. 18 shows the time required to etch through a 158 µm thick layer of nanoporous $Al_2O_3$ that has been grown on Al.

Arrays of the invention have many applications including displays, sensing and detection equipment, such as chromatography devices, and for phototherapeutic treatments (including photodynamic therapy). Arrays of the invention are exceptionally robust and can be used to form stackable modules. This makes arrays of the invention especially well-suited for important green technology. Specifically, the conversion and breakdown of greenhouse gases such as $CO_2$, into a more benign form and, preferably, into an industrial feedstock gas or vapor is a growing national priority. The inventors have recognized that arrays in accordance with the invention can meet an important need energy technologies that produce $CO_2$, as a byproduct can now be made environmentally sustainable by providing for the breakdown of the $CO_2$. Processes that produce $CO_2$ are not practical unless the $CO_2$ is disposed of because of the increasing atmospheric concentration of $CO_2$ that has been tied to global warming. The problem is exacerbated by the rising demand for energy. New coal gasification techniques, for example, are promising insofar as sulfur removal is concerned, but enormous amounts of $CO_2$ are produced which, of course, cannot simply be released into the atmosphere. Some have planned to dispose of the $CO_2$ generated by coal gasification on-site and to do so by sequestering the gas deep within the earth. Recent experiments at the University of Illinois have successfully generated uniform, diffuse plasma in 1 atmosphere of pure $CO_2$ in microchannels such as those in FIG. 3.

Arrays and devices of the invention provide a more attractive solution than storing or sequestering $CO_2$ by transforming it into a benign gas. The benign gas can be safely released into the atmosphere or, more preferably, be recycled by converting it, through a plasma chemical process in an array of microcavity plasmas, into an industrially valuable feedstock chemical such as formic acid. In this way, a present liability of power generation from coal becomes an asset and the economics of power generation and delivery can be altered radically.

Arrays of the invention are also particularly well-suited for ozone generation for the purpose of water purification, disinfection and water treatment through deodorization and decoloration. Purifying water with ozone as opposed to chlorine (or bromine) is preferable for both environmental and biological efficacy reasons. Ozone is more effective in destroying pathogens and drugs whose presence in municipal water systems is of growing concern. One of the few options available for processing gases in large volumes is plasma processing. However, gases such as $CO_2$ and $O_2$ have, in the past, been notoriously difficult to handle because these gases absorb electrons quickly which usually produces arcing and, oftentimes, leads to destruction of the plasma reactor. Microcavity plasma device arrays of the invention bypass these limitations entirely by confining the plasma to a cavity, thereby eliminating the tendency of oxygen-containing plasmas, for example, to collapse into an arc. The microplasma device arrays produced previously by the present inventors and colleagues have proven to be effective with a wide variety of gases suitable for displays, lighting, medical applications, etc. However, industrial processing of attaching gases (gases such as $CO_2$ and $O_2$ that absorb electrons quickly), requires an extraordinarily robust structure that is, nevertheless, inexpensive to fabricate. Furthermore, since the gas volume to be processed can be large (up to thousands of liters per hour or more) and the volume of microcavity plasma devices is necessarily small, a modular array that can be stacked is important and is provided by arrays of the invention. Arrays of the invention provide "modules" of devices that are easily constructed of individual arrays and can be stacked and/or placed end-to-end. To date, arrays of 48 parallel microchannels have been fabricated. One embodiment comprised four, 12 microchannel arrays, stacked back-to-back. It should also be mentioned that the microplasma arrays of the invention are well-suited for producing, in situ and on demand, gases known to be effective for medical treatment. One example is NO which in small concentrations (5-80 ppm) in air, is known to be of value in to medical treatments.

While various embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the following claims.

The invention claimed is:

1. A microplasma device, comprising:
a microcavity (16) or microchannel (21, 30) defined at least partially within a thick metal oxide layer (10) consisting essentially of defect free oxide being essentially free of microcracking; and
electrodes (12, 22*a*, 22*b*) arranged with respect to said microcavity or microchannel to stimulate plasma generation in said microcavity or microchannel upon application of suitable voltage wherein at least one of said electrodes is encapsulated within said thick metal oxide layer, wherein said thick metal oxide layer consists of nanopores that are perpendicular to a primary plane of said at least one of said electrodes and is at least tens of microns thick.

2. The device of claim 1, wherein said thick metal oxide layer is in the range of ~100-500 μm thick.

3. The device of claim 1, wherein at least one of said electrodes is encapsulated within said thick metal oxide layer such that it is isolated from said microcavity or microchannel.

4. The device of claim 1, wherein said microcavity or microchannel comprises a gentle curve at its top.

5. The device of claim 1, wherein said microcavity or microchannel comprises no sharp edges.

6. The device of claim 1, wherein said microcavity or microchannel comprises a curved bottom.

7. The device of claim 1, wherein said microcavity or microchannel comprises a flat bottom.

8. The device of claim 1, wherein said microcavity or microchannel comprises an aperture (18) permitting flow of plasma medium therethrough.

9. The device of claim 1, wherein another one of said electrodes is carried or contained in a second layer (20*a*) joined to a layer (20*b*) that includes said microcavity or microchannel, said thick metal oxide layer, and said at least one of said electrodes.

10. The device of claim 1, wherein said at least one of said electrodes is encapsulated within said thick metal oxide layer and another one of said electrodes is formed on a surface of the thick metal oxide layer.

11. The device of claim 1, wherein said at least one of said electrodes is encapsulated within said thick metal oxide layer and another one of said electrodes is encapsulated in a second metal oxide layer.

12. The device of claim 11, wherein said second metal oxide layer comprises a second microcavity or microchannel defined at least partially within another thick metal oxide consisting essentially of defect free oxide.

13. An array microplasma devices comprising a plurality of devices according to claim 1.

* * * * *